(12) United States Patent
Hirakata

(10) Patent No.: US 10,074,703 B2
(45) Date of Patent: Sep. 11, 2018

(54) LIGHT-EMITTING DEVICE AND METHOD FOR FABRICATING THE SAME

(71) Applicant: Semiconductor Energy Laboratory Co., Ltd., Atsugi-shi, Kanagawa-ken (JP)

(72) Inventor: Yoshiharu Hirakata, Ebina (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/933,404

(22) Filed: Nov. 5, 2015

(65) Prior Publication Data

US 2016/0056224 A1    Feb. 25, 2016

Related U.S. Application Data

(62) Division of application No. 13/926,217, filed on Jun. 25, 2013, now Pat. No. 9,184,211.

(30) Foreign Application Priority Data

Jul. 5, 2012    (JP) ................................ 2012-151158

(51) Int. Cl.
   *H01L 27/32*    (2006.01)
   *H01L 27/15*    (2006.01)
   (Continued)

(52) U.S. Cl.
   CPC .......... *H01L 27/3258* (2013.01); *H01L 27/15* (2013.01); *H01L 27/322* (2013.01);
   (Continued)

(58) Field of Classification Search
   CPC .................................................... H01L 27/323
   See application file for complete search history.

(56) References Cited

U.S. PATENT DOCUMENTS

| 5,834,327 A | 11/1998 | Yamazaki et al. |
| 6,781,152 B2 | 8/2004 | Yamazaki |

(Continued)

FOREIGN PATENT DOCUMENTS

| JP | 2003-174153 A | 6/2003 |
| JP | 2005-197673 A | 7/2005 |

(Continued)

OTHER PUBLICATIONS

Wada.N et al., "Novel Light-Scattering Glass Substrate for the Enhancement of OLED Lighting Out-coupling Efficiency", SID Digest '12 : SID International Symposium Digest of Technical Papers, Jun. 3, 2012, pp. 922-924.

(Continued)

*Primary Examiner* — Jae Lee
(74) *Attorney, Agent, or Firm* — Robinson Intellectual Property Law Office; Eric J. Robinson

(57) ABSTRACT

To provide a method for fabricating a light-emitting device using flexible glass which is capable of withstanding a process temperature higher than or equal to 500° C., and the light-emitting device. A second substrate is attached to a support substrate using an adsorption layer. The second substrate is bonded to a backplane substrate provided with a transistor and a light-emitting element. The backplane substrate includes a separation layer and a buffer layer. A first substrate is separated from the backplane substrate by separation between the separation layer and the buffer layer. A flexible third substrate is bonded, using a second adhesive layer, to a surface of the buffer layer exposed by the separation. The support substrate is separated from the second substrate by separation between the second substrate and the adsorption layer.

30 Claims, 13 Drawing Sheets

(51) Int. Cl.
*H01L 51/00* (2006.01)
*H01L 51/52* (2006.01)

(52) U.S. Cl.
CPC ........ *H01L 27/323* (2013.01); *H01L 27/3244* (2013.01); *H01L 51/003* (2013.01); *H01L 51/52* (2013.01); *H01L 2251/303* (2013.01); *H01L 2251/5338* (2013.01); *H01L 2251/558* (2013.01)

(56) References Cited

U.S. PATENT DOCUMENTS

| | | | |
|---|---|---|---|
| 6,956,324 B2 | 10/2005 | Yamazaki | |
| 7,037,752 B2 | 5/2006 | Kuwabara et al. | |
| 7,045,438 B2 | 5/2006 | Yamazaki et al. | |
| 7,067,392 B2 | 6/2006 | Yamazaki et al. | |
| 7,084,045 B2 | 8/2006 | Takayama et al. | |
| 7,091,070 B2 | 8/2006 | Imai et al. | |
| 7,129,102 B2 | 10/2006 | Yamazaki | |
| 7,180,091 B2 | 2/2007 | Yamazaki et al. | |
| 7,180,093 B2 | 2/2007 | Takayama et al. | |
| 7,180,197 B2 | 2/2007 | Nishi et al. | |
| 7,189,631 B2 | 3/2007 | Yamazaki et al. | |
| 7,307,006 B2 | 12/2007 | Okazaki et al. | |
| 7,335,573 B2 | 2/2008 | Takayama et al. | |
| 7,341,924 B2 | 3/2008 | Takayama et al. | |
| 7,399,991 B2 | 7/2008 | Seo et al. | |
| 7,483,091 B1 | 1/2009 | Yamazaki et al. | |
| 7,514,868 B2 | 4/2009 | Yamazaki et al. | |
| 7,663,149 B2 | 2/2010 | Seo et al. | |
| 7,691,686 B2 | 4/2010 | Nishi et al. | |
| 7,727,809 B2 | 6/2010 | Ito et al. | |
| 8,119,490 B2 | 2/2012 | Ohnuma et al. | |
| 8,188,474 B2 | 5/2012 | Hatano et al. | |
| 8,222,666 B2 | 7/2012 | Hatano et al. | |
| 8,228,454 B2 | 7/2012 | Yamazaki et al. | |
| 8,264,144 B2 | 9/2012 | Oikawa et al. | |
| 8,284,369 B2 | 10/2012 | Chida et al. | |
| 8,288,245 B2 | 10/2012 | Ohnuma et al. | |
| 8,354,962 B2 | 1/2013 | Aoki | |
| 8,367,440 B2 | 2/2013 | Takayama et al. | |
| 8,377,552 B2 | 2/2013 | Kondo et al. | |
| 8,377,762 B2 | 2/2013 | Eguchi et al. | |
| 8,404,563 B2 | 3/2013 | Hanaoka | |
| 8,432,021 B2 | 4/2013 | Moriwaka | |
| 8,486,804 B2 | 7/2013 | Yamazaki et al. | |
| 8,502,444 B2 | 8/2013 | Chu et al. | |
| 8,507,322 B2 | 8/2013 | Chida et al. | |
| 2001/0040645 A1* | 11/2001 | Yamazaki | G02F 1/133305 349/42 |
| 2004/0099926 A1 | 5/2004 | Yamazaki et al. | |
| 2008/0049437 A1 | 2/2008 | Takayama et al. | |
| 2008/0135175 A1 | 6/2008 | Higuchi | |
| 2009/0096760 A1 | 4/2009 | Ma et al. | |
| 2009/0302339 A1 | 12/2009 | Yamazaki et al. | |
| 2010/0006845 A1 | 1/2010 | Seo et al. | |
| 2010/0013745 A1* | 1/2010 | Kim | G06F 3/0412 345/76 |
| 2010/0054291 A1 | 3/2010 | Yukawa et al. | |
| 2010/0123160 A1 | 5/2010 | Hatano et al. | |
| 2010/0188354 A1 | 7/2010 | Tamura | |
| 2010/0293782 A1 | 11/2010 | Yamazaki et al. | |
| 2011/0001146 A1 | 1/2011 | Yamazaki et al. | |
| 2011/0007042 A1 | 1/2011 | Miyaguchi | |
| 2011/0050657 A1 | 3/2011 | Yamada | |
| 2011/0175101 A1 | 7/2011 | Hatano et al. | |
| 2011/0318889 A1 | 12/2011 | Chida | |
| 2012/0126693 A1 | 5/2012 | Seo et al. | |
| 2012/0156457 A1 | 6/2012 | Kondo | |
| 2012/0205675 A1 | 8/2012 | Yamazaki et al. | |
| 2012/0262432 A1 | 10/2012 | Kamata et al. | |
| 2012/0327334 A1* | 12/2012 | Heo | G02F 1/133502 349/96 |
| 2013/0127776 A1* | 5/2013 | Guard | G06F 3/0412 345/174 |
| 2013/0194205 A1* | 8/2013 | Park | G06F 3/044 345/173 |
| 2014/0008668 A1 | 1/2014 | Hirakata | |
| 2014/0014960 A1 | 1/2014 | Yamazaki et al. | |

FOREIGN PATENT DOCUMENTS

| | | |
|---|---|---|
| JP | 2010-244694 A | 10/2010 |
| JP | 2010-244698 A | 10/2010 |
| JP | 2011-075809 A | 4/2011 |

OTHER PUBLICATIONS

Taiwanese Office Action (Application No. 102122519) dated Jul. 27, 2017.

* cited by examiner

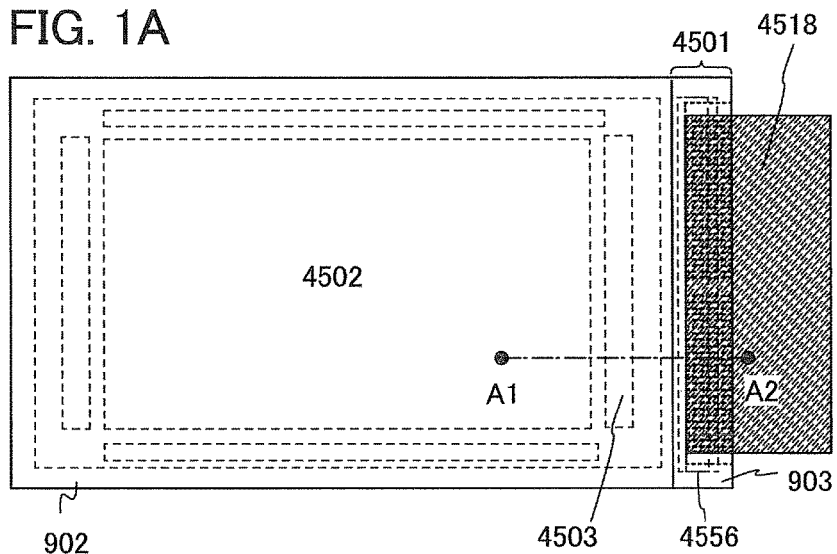
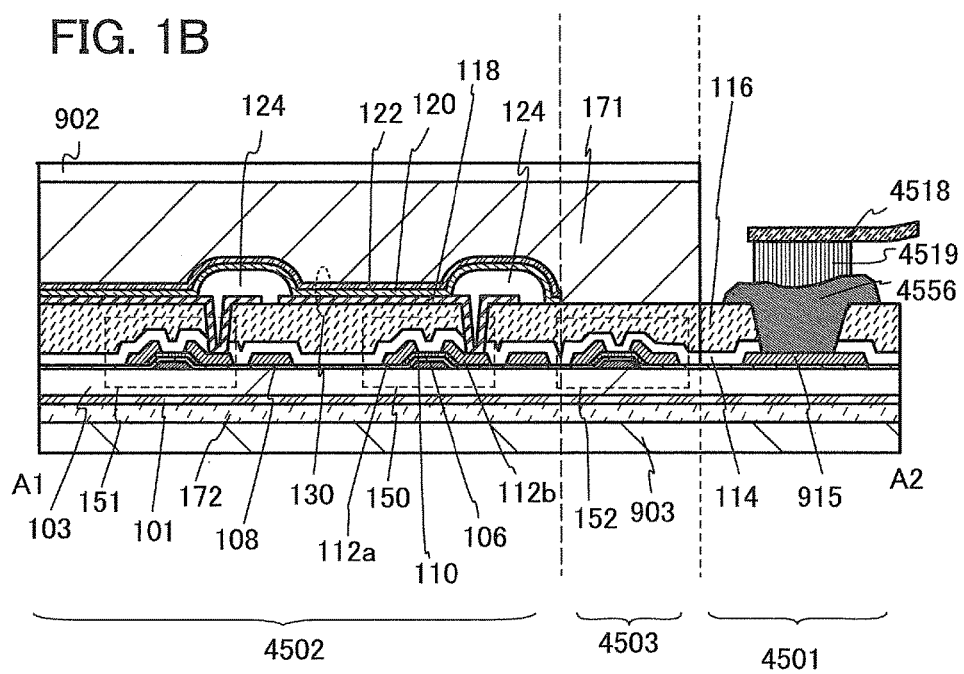

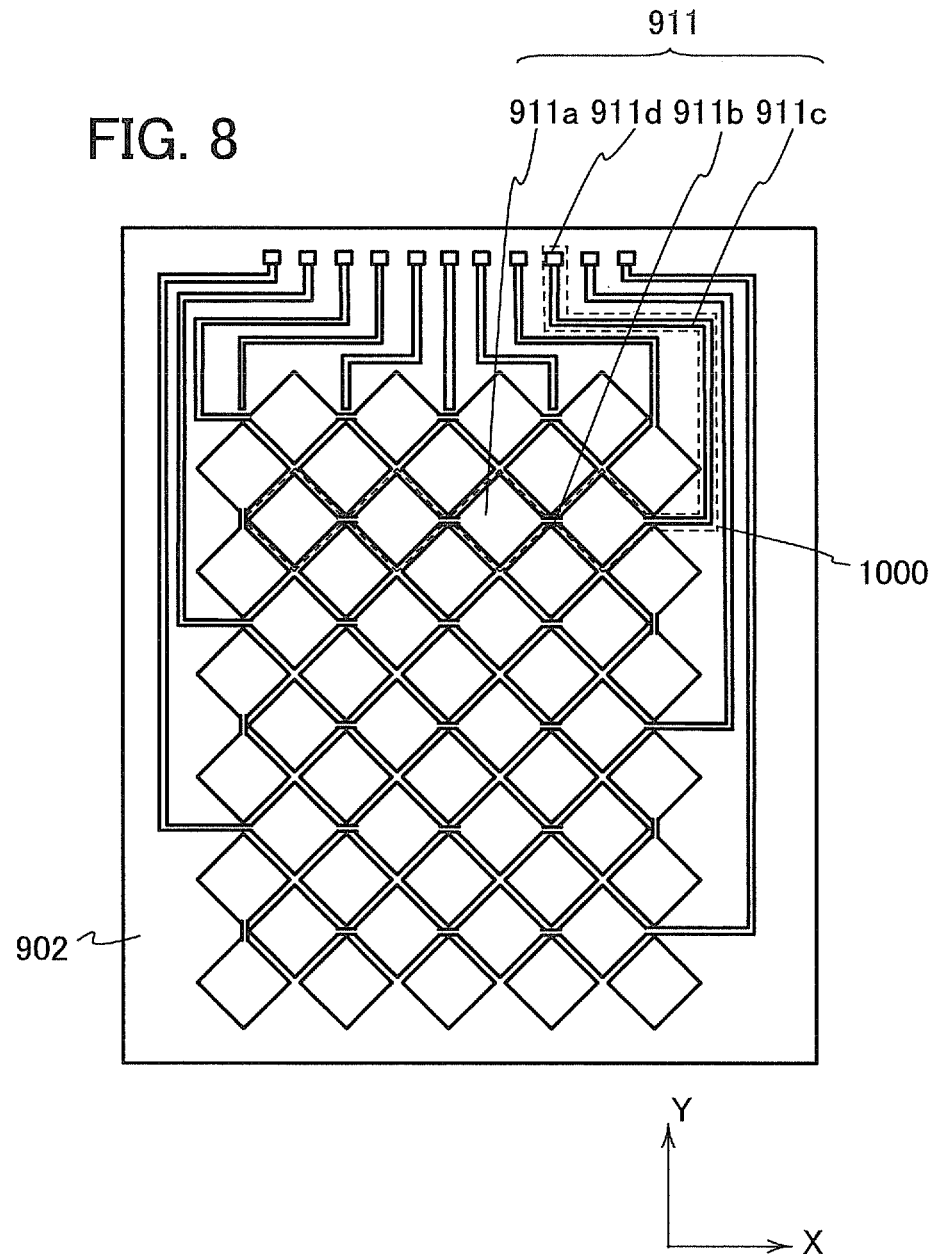

LIGHT-EMITTING DEVICE AND METHOD FOR FABRICATING THE SAME

BACKGROUND OF THE INVENTION

1. Field of the Invention

The present invention relates to a light-emitting device using an organic electroluminescence (hereinafter also referred to as EL) phenomenon, and a method for fabricating the light-emitting device.

2. Description of the Related Art

In recent years, research and development have been actively conducted on light-emitting elements utilizing organic EL (organic EL elements). In the fundamental structure of the organic EL element, a layer containing a light-emitting organic compound (EL layer) is sandwiched between a pair of electrodes.

Since the organic EL element is a self-luminous type, a light-emitting device including the organic EL element has advantages of high visibility, no necessity of a backlight, low power consumption, and the like. In addition, the light-emitting device including the organic EL element also has advantages that it can be thin and lightweight and it is highly responsive to input signals.

Furthermore, the light-emitting device including an organic EL element can achieve reduction in thickness and weight, and further have flexibility and high impact resistance; therefore, use of such a light-emitting element for a substrate having flexibility (a flexible substrate) has been proposed. The substrate having flexibility is used not only in a light-emitting device but also in a semiconductor device or the like which operates by utilizing semiconductor characteristics.

For example, Patent Document 1 discloses a flexible active matrix light-emitting device in which an organic EL element or a transistor serving as a switching element is provided over a film substrate.

REFERENCE

[Patent Document 1] Japanese Published Patent Application No. 2003-174153

SUMMARY OF THE INVENTION

Recently, in a method for fabricating a flexible light-emitting device including an organic EL element, a method in which flexible glass is attached to a support substrate with a resin film provided therebetween and a transistor, an organic EL element, and the like are fabricated over the glass has been studied.

However, since the resin film is provided on the support substrate, when a semiconductor layer of the transistor is directly formed on the flexible glass, the semiconductor layer may be contaminated by impurities from the resin film, which might become a problem. Further, also in high-temperature treatment after formation of the semiconductor layer, the diffusion of impurities from the resin film to the semiconductor layer might become a problem. Furthermore, due to a difference in thermal stress between the resin film and the glass, when heat treatment is performed, the glass might be warped and separated from the support substrate.

An object of one embodiment of the present invention is to provide a method for fabricating a light-emitting device including an organic EL element and to provide the light-emitting device. The light-emitting device is fabricated with the use of a substrate in which flexible glass is attached to a support substrate with a resin film. The light-emitting device is capable of withstanding a process temperature higher than or equal to 500° C.

A transistor and an organic EL element are formed over a formation substrate which is different from the support substrate to which the flexible glass is attached with the use of the resin film. The formation substrate provided with the transistor and the like and the support substrate to which the flexible glass is attached with the use of the resin film are bonded together with an adhesive layer.

One embodiment of the present invention is a method for fabricating a light-emitting device, which includes a first step in which a backplane substrate is fabricated by forming a separation layer over a first substrate, forming a buffer layer over the separation layer, forming a plurality of transistors over the buffer layer, forming an insulating layer over the transistors, and forming a light-emitting element electrically connected to the transistors, a second step in which an adsorption layer is formed over a support substrate and a second substrate with a thickness greater than or equal to 10 µm and less than or equal to 500 µm is attached to the support substrate so that the second substrate is in contact with the adsorption layer, a third step in which the second substrate is coated with a first adhesive layer and the second substrate is bonded, using the first adhesive layer, to a surface of the backplane substrate over which the light-emitting element is formed, a fourth step in which the first substrate is separated from the backplane substrate by separation between the separation layer and the buffer layer and a third substrate is bonded, using a second adhesive layer, to a surface of the buffer layer exposed by the separation, and a fifth step in which the support substrate is separated from the second substrate by separation between the second substrate and the adsorption layer. Here, the third step is performed after the first step and the second step, and then, the fourth step and the fifth step are performed. Note that the first step may be conducted before or after the second step. Further, the fourth step may be conducted before or after the fifth step. It is preferable that flexible glass be used as the second substrate and resin be used as the third substrate.

By the above-described method, the transistors can be formed at a process temperature higher than or equal to 500° C. Hence, high-performance transistors can be fabricated. Further, it is possible to obtain a thin and flexible light-emitting device in which one of substrates is formed using flexible glass and the other substrate is formed using resin. Furthermore, since the light-emitting element is sealed with the flexible glass, a highly reliable light-emitting device can be fabricated.

In the second step, it is preferable to form a touch sensor over the second substrate, an insulating layer over the touch sensor, and a coloring layer over the insulating layer after the second substrate is attached to the support substrate.

By the above-described method, it is possible to obtain a thin and flexible light-emitting device capable of performing full-color display in which one of substrates is provided with the coloring layer. Further, since the touch sensor can be formed in contact with the thin substrate over the surface of the light-emitting device, the detection accuracy of the touch sensor can be improved.

Another embodiment of the present invention is a light-emitting device including a flexible substrate, a second adhesive layer over the substrate, a buffer layer over the second adhesive layer, a transistor over the buffer layer, a planarizing layer over the transistor, a light-emitting element over the planarizing layer which is electrically connected to the transistor, a first adhesive layer over the light-emitting element and the planarizing layer, and a glass substrate with a thickness greater than or equal to 10 μm and less than or equal to 500 μm over the first adhesive layer. Note that the flexible substrate is preferably a resin substrate.

With the above-described structure of the light-emitting device, it is possible to obtain a thin and flexible light-emitting device in which one of substrates is formed using flexible glass and the other substrate is formed using resin. Since the light-emitting element is sealed with the flexible glass, a highly reliable light-emitting device can be obtained.

Further, a touch sensor and a coloring layer are preferably included between the glass substrate and the first adhesive layer, and the touch sensor is preferably closer to the glass substrate side than the coloring layer is.

With the above-described structure of the light-emitting device, it is possible to obtain a thin and flexible light-emitting device capable of performing full-color display in which one of substrates is provided with the coloring layer. Further, since the touch sensor can be formed in contact with the thin substrate over the surface of the light-emitting device, the detection accuracy of the touch sensor can be improved.

It is possible to provide a method for fabricating a light-emitting device including an organic EL element using flexible glass which is capable of withstanding a process temperature higher than or equal to 500° C., and the light-emitting device.

BRIEF DESCRIPTION OF THE DRAWINGS

FIGS. 1A and 1B are a top view and a cross-sectional view, respectively, illustrating a light-emitting device of one embodiment of the present invention.

FIG. 8 is a top view illustrating one embodiment of the touch panel.

DETAILED DESCRIPTION OF THE INVENTION

Figure 2A:
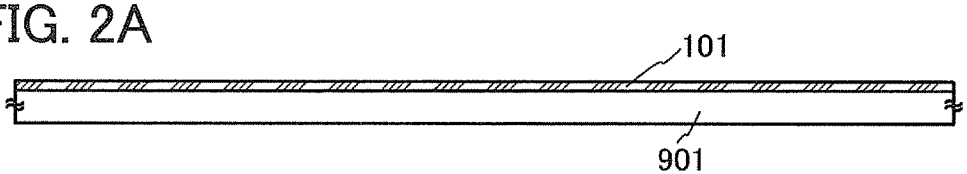
FIGS. 2A to 2F are cross-sectional views illustrating a method for fabricating the light-emitting device of one embodiment of the present invention.

A light-emitting device which is one embodiment of the present invention will be described below with reference to drawings.

Embodiment 1

<Structure of Light-Emitting Device>

FIG. 1A is a top view of a light-emitting device according to one embodiment of the present invention, and FIG. 1B is a cross-sectional view taken along the line A1-A2 in FIG. 1A.

A light-emitting device illustrated in FIG. 1A includes a terminal portion 4501, a pixel portion 4502, and a signal line circuit portion 4503.

As shown in FIG. 1B, the light-emitting device includes, in the pixel portion 4502, a third substrate 903, a second adhesive layer 172, a separation layer 101, a buffer layer 103, a plurality of transistors, an insulating layer 114, a planarizing layer 116, a light-emitting element 130, a partition wall 124, a first adhesive layer 171, and a second substrate 902.

As shown in FIG. 1B, the plurality of transistors is provided over the third substrate 903, and the light-emitting element 130 is provided over each of a transistor 150 and a transistor 151. Each transistor includes a gate electrode layer 106, a source electrode layer 112a, a drain electrode layer 112b, a semiconductor layer 110, and a gate insulating layer 108. The transistor 150 and the transistor 151 are each a transistor for driving the light-emitting element. The light-emitting element 130 is electrically connected to a transistor located under the light-emitting element 130. The light-emitting element 130 is provided over the planarizing layer 116. A first electrode layer 118 of the light-emitting element 130 is electrically connected to the transistor through a contact hole in the planarizing layer 116. The light-emitting element 130 is sealed with the first adhesive layer 171 and the second substrate 902. A plurality of touch sensors to be described later may be provided on the inner surface of the second substrate 902, and the light-emitting device may include a touch panel.

In this embodiment, the light-emitting device having a top emission structure is exemplified; however, the light-emitting device may have a bottom emission structure or a dual emission structure.

The light-emitting element 130 includes the first electrode layer 118 electrically connected to the transistor, an organic compound-containing layer 120 over the first electrode layer 118, and a second electrode layer 122 over the organic compound-containing layer 120. An edge portion of the first electrode layer 118 is covered with the partition wall 124. The second electrode layer 122 is formed over an entire surface of the pixel portion 4502.

As shown in FIG. 1B, the light-emitting device includes a transistor 152 in the signal line circuit portion 4503.

As shown in FIG. 1B, the light-emitting device includes, in the terminal portion 4501, a conductive layer 915, a bump 4556, an anisotropic conductive film 4519, and a flexible printed circuit (FPC) 4518. In the FPC 4518, a variety of electric components for driving and controlling the pixel portion 4502 is disposed.

The conductive layer 915 is electrically connected to the FPC 4518 via the bump 4556 and the anisotropic conductive film 4519. Note that the bump 4556 is not necessarily provided. It is preferable that the conductive layer 915 be in direct contact with the anisotropic conductive film 4519 to be electrically connected to the FPC 4518.

Figure 7A:
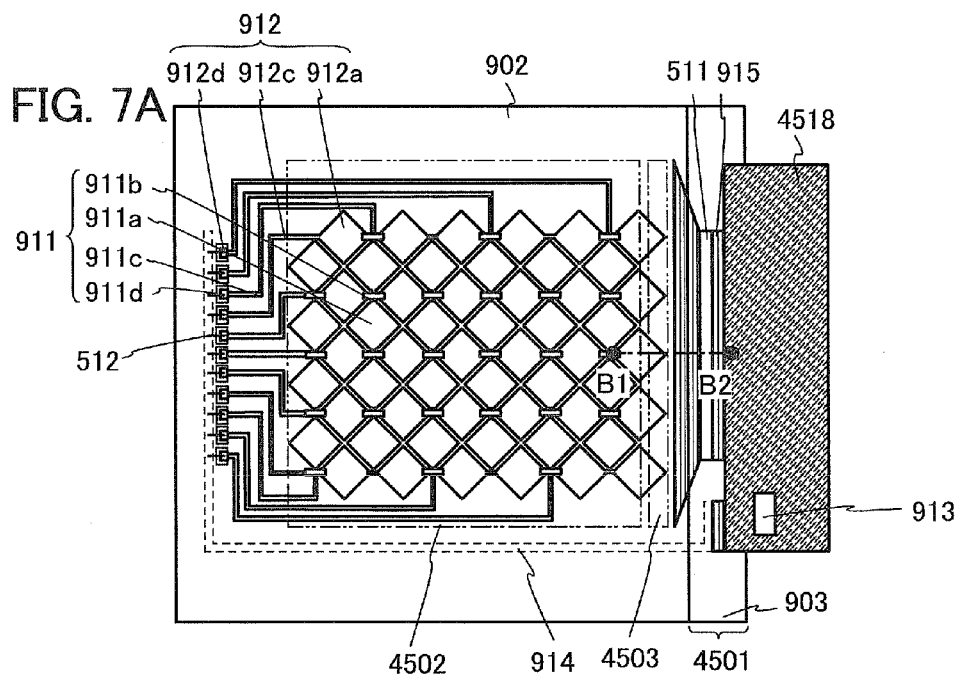
FIGS. 7A and 7B are a top view and a cross-sectional view, respectively, illustrating the light-emitting device of one embodiment of the present invention.
Figure 7B:
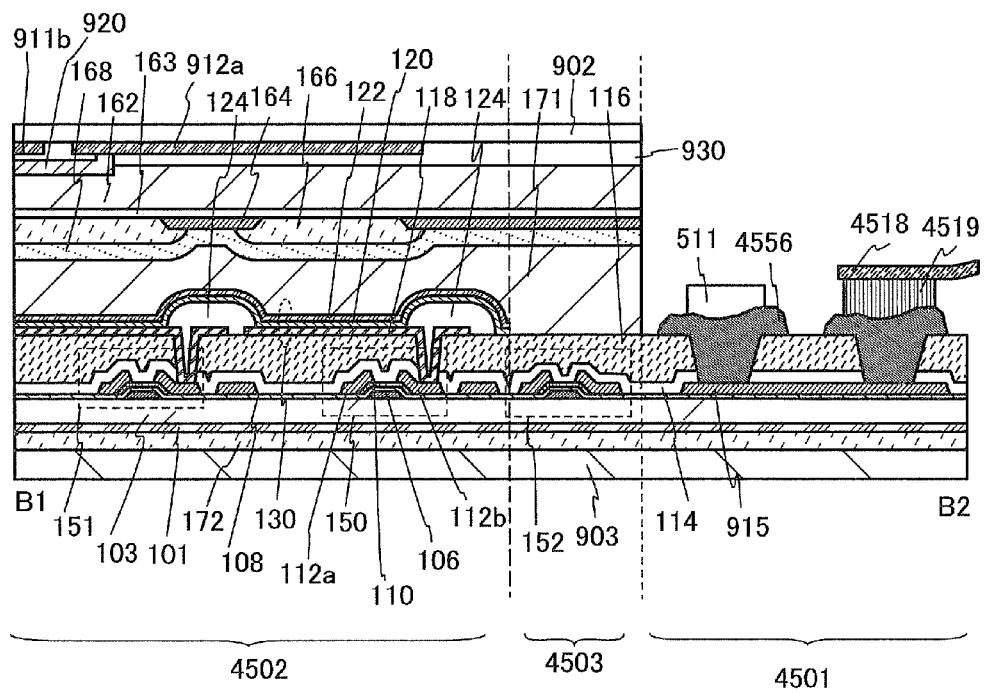

FIG. 7A is a top view of a light-emitting device according to another embodiment of the present invention, and FIG. 7B is a cross-sectional view taken along the line B1-B2 in FIG. 7A. In FIG. 7A, a touch panel formed on the second substrate 902 side is illustrated in detail.

The light-emitting device illustrated in FIG. 7A includes the terminal portion 4501, the pixel portion 4502, and the signal line circuit portion 4503.

As shown in FIG. 7B, the light-emitting device includes, in the pixel portion 4502, the third substrate 903, the second adhesive layer 172, the separation layer 101, the buffer layer 103, the plurality of transistors, the insulating layer 114, the planarizing layer 116, the light-emitting element 130, the partition wall 124, the first adhesive layer 171, an overcoat layer 168, a coloring layer 166, a light-blocking film 164, a passivation layer 163, an insulating layer 162, a joining portion 911*b* of a conductive layer, a main body portion 912*a* of a conductive layer, a conductive layer 920, an insulating layer 930, and the second substrate 902.

As shown in FIG. 7B, the plurality of transistors is provided over the third substrate 903, and the light-emitting element 130 is provided over each of the transistor 150 and the transistor 151. The structures of the transistors and the light-emitting element are similar to those in FIG. 1B.

As shown in FIG. 7B, the joining portion 911*b* of the conductive layer, the main body portion 912*a* of the conductive layer, the insulating layer 930 covering the joining portion 911*b* of the conductive layer and the main body portion 912*a* of the conductive layer, and the conductive layer 920 for electrically connecting a plurality of main body portions 912*a* of the conductive layers are provided on the second substrate 902 side. Since the coloring layer 166 and the like are provided on the conductive layer 920, the insulating layer 162 between the conductive layer 920 and the coloring layer 166 preferably has a planarization function. Further, the passivation layer 163 is not necessarily provided.

As shown in FIG. 7B, the light-emitting device includes the transistor 152 in the signal line circuit portion 4503.

As shown in FIG. 7B, the light-emitting device includes, in the terminal portion 4501, the conductive layer 915, the bump 4556, a display driving IC 511, the anisotropic conductive film 4519, and the FPC 4518.

The conductive layer 915 is electrically connected to the FPC 4518 via the bump 4556 and the anisotropic conductive film 4519. Note that the bump 4556 is not necessarily provided. It is preferable that the conductive layer 915 be in direct contact with the anisotropic conductive film 4519 to be electrically connected to the FPC 4518. Further, the conductive layer 915 is electrically connected to the display driving IC 511 via the bump 4556. Note that the bump 4556 is not necessarily provided. It is preferable that the conductive layer 915 be in direct contact with the display driving IC 511. The display driving IC 511 and the FPC 4518 are electrically connected to each other via the conductive layer 915.

Over the third substrate 903, a data line 914 is formed along the periphery of the pixel portion 4502 (FIG. 7A). The data line 914 serves to transmit, to the FPC 4518, electric signals generated in the conductive layers 911 and 912 formed on the inner surface of the second substrate 902.

A plurality of connection portions 512 over the third substrate 903 is formed in positions corresponding to a connection portion 911*d* of the conductive layer 911 and a connection portion 912*d* of the conductive layer 912 which are provided on the second substrate 902. The plurality of connection portions 512 is electrically connected to the connection portions 911*d* and 912*d* via conductive members. As the conductive members, any of a variety of conductive materials such as Ag paste can be used. Each of the connection portions 512 is electrically connected to the data line 914. The data line 914 is electrically connected to the FPC 4518.

In the FPC 4518, a touch panel driving IC 913 for driving and controlling the touch panel is disposed. Electric signals generated in the conductive layers 911, 912, and 920 formed on the inner surface of the second substrate 902 are input to the touch panel driving IC 913.

A method for driving the touch panel in the light-emitting device according to one embodiment of the present invention is briefly described below. Note that in this specification, a sensor that can sense proximity or touch of an object is referred to as a touch sensor, and a touch panel includes a plurality of touch sensors.

When a finger, a conductive object, or a high dielectric constant object comes close to or touches a surface of the light-emitting device according to one embodiment of the present invention, the light-emitting device interprets change in electrostatic capacitance of a conductor which is caused by such proximity, thereby sensing a touch. At this time, the coordinates of the object being close to or touching the surface (and a pressure value of the object pressing the surface) are output.

The touch sensor includes a pair of electrodes. A capacitor is formed between the pair of electrodes. Input voltage is input to one of the pair of electrodes. Further, current flowing in the other electrode (or a potential of the other electrode) is detected by a detection circuit. Although FIGS. 7A and 7B illustrate an example of using the conductive layer 911 and the conductive layer 912 as the pair of electrodes of the touch sensor, an electrode on the second substrate 902 side (at least one of the conductive layer 911 and the conductive layer 912) and the second electrode layer 122 may be used as the pair of electrodes of the touch sensor.

A cathode voltage as a constant voltage is applied to the second electrode layer 122 of the pixel portion 4502. In the light-emitting device of one embodiment of the present invention, the electrode on the second substrate 902 side and the second electrode layer 122 can form one capacitor. An electrostatic capacitance between the electrode on the second substrate 902 side and the second electrode layer 122 is kept constant. In such a condition, when a finger, a conductive object, or a high dielectric constant object comes close to or touches an upper surface of the second substrate 902, the finger or the like and the electrode on the second substrate 902 side form a second capacitor. Thus, on the whole, two capacitors are connected in series, and a total electrostatic capacitance is changed. By using the position and the amount of the change in electrostatic capacitance, a touch sensing system is actuated.

<Components in Light-Emitting Device>

The following describes components included in the light-emitting device of one embodiment of the present invention.

(Third Substrate)

It is preferable to use, as the third substrate 903, a substrate which has a thermal expansion coefficient lower than or equal to 10 ppm/K and is less likely to be deformed by being heated. Such a substrate is preferable because, if the third substrate 903 is heated, a crack is hardly generated in a resin or a wiring in contact with the third substrate 903. As a material for the third substrate 903, a polyethylene terephthalate resin, a polyethylene naphthalate resin, a polyacrylonitrile resin, a polyimide resin, a polymethyl methacrylate resin, a polycarbonate resin, a polyethersulfone resin, a polyamide resin, a polystyrene resin, a polyamide imide resin, a polyvinylchloride resin, or the like is preferably used.

(Separation Layer)

The separation layer 101 is formed between a first substrate 901 and the transistor 150. The separation layer 101 has a single-layer structure or a layered structure containing at least one of the following: an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements. A crystal structure of a layer containing silicon may be amorphous, microcrystal, or polycrystal. Furthermore, a metal oxide such as aluminum oxide, gallium oxide, zinc oxide, titanium dioxide, indium oxide, indium tin oxide, indium zinc oxide, or an In—Ga—Zn-based metal oxide can be used for the separation layer 101.

When the separation layer 101 has a single-layer structure, it is preferable to form a tungsten layer, a molybdenum layer, or a layer containing a mixture of tungsten and molybdenum. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

When the separation layer 101 has a layered structure including a layer including tungsten and a layer including oxide of tungsten, it may be utilized that the layer including tungsten is formed first and an insulating layer formed of oxide is formed thereover so that a layer including an oxide of tungsten is formed at the interface between the tungsten layer and the insulating layer. Alternatively, the layer including oxide of tungsten may be formed by performing thermal oxidation treatment, oxygen plasma treatment, treatment with a highly oxidizing solution such as ozone water, or the like on the surface of the layer including tungsten.

In this embodiment, an example in which the third substrate 903 and the separation layer 101 are bonded to each other with the second adhesive layer 172 is illustrated. However, it is not necessary that the light-emitting device of one embodiment of the present invention include the separation layer 101. For example, the third substrate 903 and the buffer layer 103 may be bonded to each other with the second adhesive layer 172.

Note that since the light-emitting device with a top-emission structure is exemplified in this embodiment, the separation layer 101 does not necessarily have a light-transmitting property. In the case where the separation layer 101 is included in a light-emitting device with a bottom-emission structure or a dual-emission structure, the separation layer 101 is formed using a light-transmitting property.

(Second Substrate)

It is preferable to use glass with a thickness greater than or equal to 10 μm and less than or equal to 500 μm as the second substrate 902. The thickness in the above-described range allows the second substrate 902 to be light and flexible.

(Buffer Layer)

The buffer layer 103 can be formed using one insulating film or stacked insulating films which is/are selected from the following: an oxide insulating film such as a silicon oxide film, a gallium oxide film, a hafnium oxide film, a yttrium oxide film, or an aluminum oxide film; a nitride insulating film such as a silicon nitride film or an aluminum nitride film; an oxynitride insulating film such as a silicon oxynitride film or an aluminum oxynitride film; or a nitride oxide insulating film such as a silicon nitride oxide film. Note that "silicon nitride oxide" contains more nitrogen than oxygen and "silicon oxynitride" contains more oxygen than nitrogen.

(Gate Electrode Layer)

The gate electrode layer 106 can be formed using a metal material such as molybdenum, titanium, tantalum, tungsten, aluminum, copper, chromium, neodymium, or scandium, or an alloy material which includes any of these as a main component. Alternatively, a semiconductor film typified by a polycrystalline silicon film doped with an impurity element such as phosphorus, or a silicide film such as a nickel silicide film may be used as the gate electrode layer 106. The gate electrode layer 106 may have a single-layer structure or a stacked structure.

(Gate Insulating Layer)

The gate insulating layer 108 can be formed using one insulating film or stacked insulating films which is/are selected from the following: an oxide insulating film such as a silicon oxide film, a gallium oxide film, a hafnium oxide film, a yttrium oxide film, or an aluminum oxide film; a nitride insulating film such as a silicon nitride film or an aluminum nitride film; an oxynitride insulating film such as a silicon oxynitride film or an aluminum oxynitride film; or a nitride oxide insulating film such as a silicon nitride oxide film.

The gate insulating layer 108 is formed by a plasma CVD (chemical vapor deposition) method or a sputtering method. Among plasma CVD methods, the following plasma CVD method that is also referred to as a microwave plasma CVD method is preferably used: plasma is generated by utilizing field effect energy of a microwave particularly, a source gas of a gate insulating film is excited by the plasma, the excited source gas is reacted over a formation subject, and the reactant is deposited. The thickness of the gate insulating layer 108 is greater than or equal to 5 nm and less than or equal to 300 nm.

(Semiconductor Layer)

The semiconductor layer 110 can be formed using silicon or an oxide semiconductor. In the fabrication method according to the present invention, the semiconductor layer 110 is formed over the first substrate 901. Hence, the semiconductor layer 110 can be formed at a temperature higher than or equal to 500° C. or can be subjected to annealing. Thus, a transistor with high on-state current and high field effect mobility can be fabricated. Note that the details of the oxide semiconductor which can be used for the semiconductor layer 110 will be described in Embodiment 2.

(Source Electrode Layer and Drain Electrode Layer)

As the conductive film used for the source electrode layer 112a and the drain electrode layer 112b, for example, a metal film including an element selected from Al, Cr, Cu, Ta, Ti, Mo, and W, a metal nitride film including any of these elements (a titanium nitride film, a molybdenum nitride film, or a tungsten nitride film), or the like can be used. Alternatively, a film of a high-melting-point metal such as Ti, Mo, or W or a metal nitride film thereof (e.g., a titanium nitride film, a molybdenum nitride film, or a tungsten nitride film) may be formed over or/and below a metal film such as an Al film or a Cu film. Alternatively, the conductive film used for the source electrode layer 112a and the drain electrode layer 112b may be formed using a conductive metal oxide. As the conductive metal oxide, indium oxide ($In_2O_3$ or the like), tin oxide ($SnO_2$ or the like), zinc oxide (ZnO), indium tin oxide (ITO), indium zinc oxide ($In_2O_3$—ZnO or the like), or any of these metal oxide materials in which silicon oxide is contained can be used.

(Insulating Layer)

As the insulating layer 114, a silicon nitride film is preferably formed by a plasma CVD method with use of a mixed gas of silane ($SiH_4$) and nitrogen ($N_2$) as a supply gas. The insulating layer 114 may be formed using a material which is the same or substantially the same as that of the gate insulating layer 108.

(Planarizing Layer)

The planarizing layer 116 can be formed using an organic resin material such as polyimide resin or acrylic resin or an inorganic insulating material such as silicon oxide.

(Light-Emitting Element)

The light-emitting element 130 includes the organic compound-containing layer 120 provided between the first electrode layer 118 and the second electrode layer 122. The organic compound-containing layer 120 includes at least a light-emitting layer and includes a plurality of layers. The organic compound-containing layer 120 will be described in Embodiment 3.

In this embodiment, in order to exemplify the light-emitting device with a top-emission structure, the second electrode layer 122 is formed using a conductive film that transmits visible light. The first electrode layer 118 is preferably formed using a conductive film that reflects visible light. Note that one of the first electrode layer 118 and the second electrode layer 122 serves as an anode and the other serves as a cathode.

The conductive film that transmits visible light can be formed using, for example, indium oxide, ITO, indium zinc oxide, ZnO, or ZnO to which gallium is added. Alternatively, a film of a metal material such as gold, platinum, nickel, tungsten, chromium, molybdenum, iron, cobalt, copper, palladium, or titanium, or a nitride of any of these metal materials (e.g., titanium nitride) can be formed thin so as to have a light-transmitting property. Further alternatively, graphene or the like may be used.

The conductive film that reflects visible light can be formed using, for example, a metal material such as aluminum, gold, platinum, silver, nickel, tungsten, chromium, molybdenum, iron, cobalt, copper, or palladium; an aluminum-containing alloy (aluminum alloy) such as an alloy of aluminum and titanium, an alloy of aluminum and nickel, or an alloy of aluminum and neodymium; or a silver-containing alloy such as an alloy of silver and copper. An alloy of silver and copper is preferable because of its high heat resistance. The metal material or the alloy may include lanthanum, neodymium, germanium, or the like.

It is preferable that the first electrode layer 118 be formed using the conductive film that reflects visible light because light extraction efficiency of the light-emitting element can be improved.

(Partition Wall)

The partition wall 124 can be formed using an inorganic insulating material or an organic insulating material. As the organic insulating material, for example, a negative or positive photosensitive resin material, a non-photosensitive resin material, or the like can be used. Specifically, a polyimide resin, an acrylic resin, or the like can be used.

(Coloring Layer, Light-Blocking Film, and Overcoat Layer)

The coloring layer 166 is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each color filter is formed in a desired position using a known material by a printing method, an inkjet method, an etching method using photolithography, or the like.

Although a method using three colors of R, G, and B is described in this embodiment, a structure in which four colors such as R, G, B, and Y (yellow) are used, or a structure in which five or more colors are used may alternatively be employed.

The light-blocking film 164 shields a pixel from light emitted from the light-emitting element 130 in an adjacent pixel to prevent color mixture between the adjacent pixels. Here, the end portions of the coloring layer 166 are provided to overlap with the light-blocking film 164, whereby light leakage can be suppressed. The light-blocking film 164 can be formed using a material that blocks light emitted from the light-emitting element 130, for example, a metal or an organic resin. Note that the light-blocking film 164 and the overcoat layer 168 may be provided only in the pixel portion 4502 or may be provided also in a region other than the pixel portion 4502, e.g., in the signal line circuit portion 4503.

A material which is the same or substantially the same as that of the planarizing layer 116 can be used for the insulating layer 162. Further, the passivation layer 163 can be formed using an inorganic insulating material which can be used for the gate insulating layer 108 or the like.

The overcoat layer 168 can be formed using an organic resin film of an acrylic resin, a polyimide resin, or the like. The overcoat layer 168 can prevent impurity components or the like contained in the coloring layer 166 from diffusing to the organic compound-containing layer 120 side. The overcoat layer 168 may have a layer structure of an organic resin film and an inorganic insulating film. Silicon nitride, silicon oxide, or the like can be used for the inorganic insulating film. Note that the overcoat layer 168 is not necessarily provided.

(First Adhesive Layer)

The first adhesive layer 171 is provided between the second electrode layer 122 and the second substrate 902 to bond the second substrate 902 to the third substrate 903. As the first adhesive layer 171, a light curable adhesive, a reactive curable adhesive, a thermal curable adhesive, and an anaerobic adhesive can be used. For example, an epoxy resin, an acrylic resin, an imide resin, or the like can be used. A dry agent (zeolite or the like) having a size less than or equal to the wavelength of light, or a filler with a high refractive index (titanium oxide, zirconium, or the like) is preferably mixed into the adhesive because reliability and light extraction efficiency of the light-emitting element 130 are improved.

(Second Adhesive Layer)

The second adhesive layer 172 can be formed using a material which is the same or substantially the same as that of the first adhesive layer 171.

(Touch Panel)

The touch panel formed on one surface of the second substrate 902 in the light-emitting device according to one embodiment of the present invention is described below.

Figure 9:
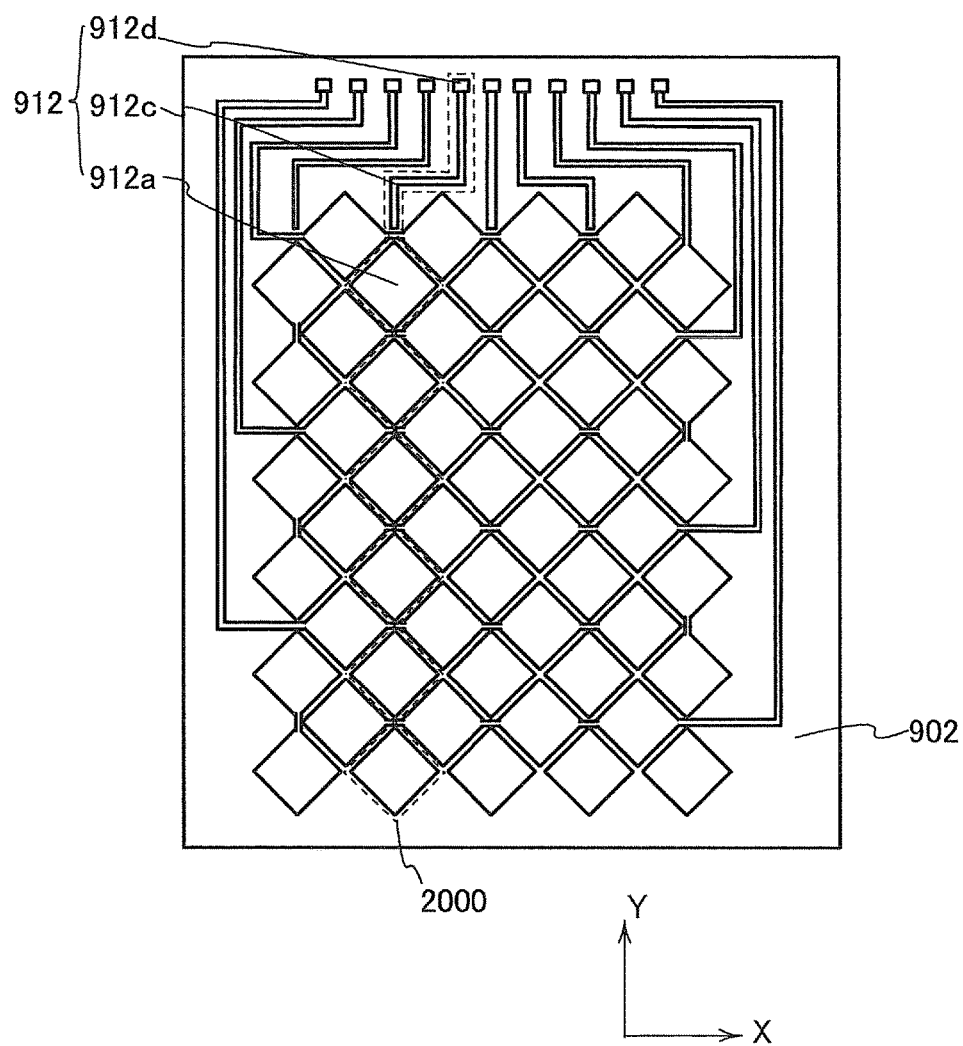
FIG. 9 is a top view illustrating one embodiment of the touch panel.
Figure 10:
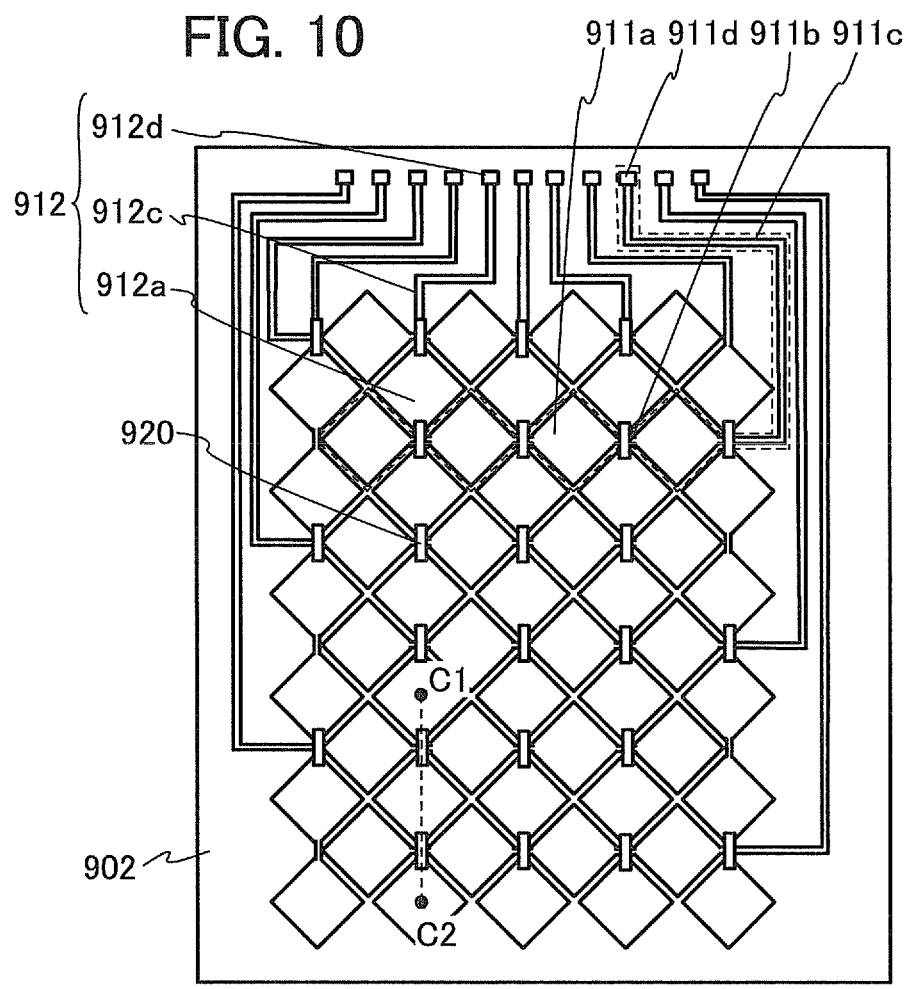
FIG. 10 is a top view illustrating one embodiment of the touch panel.
Figure 11:
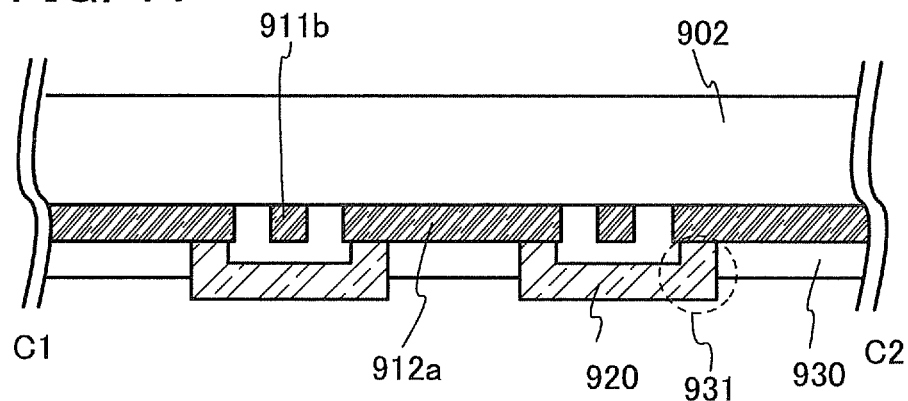
FIG. 11 is a cross-sectional view illustrating one embodiment of the touch panel.
Figure 12:
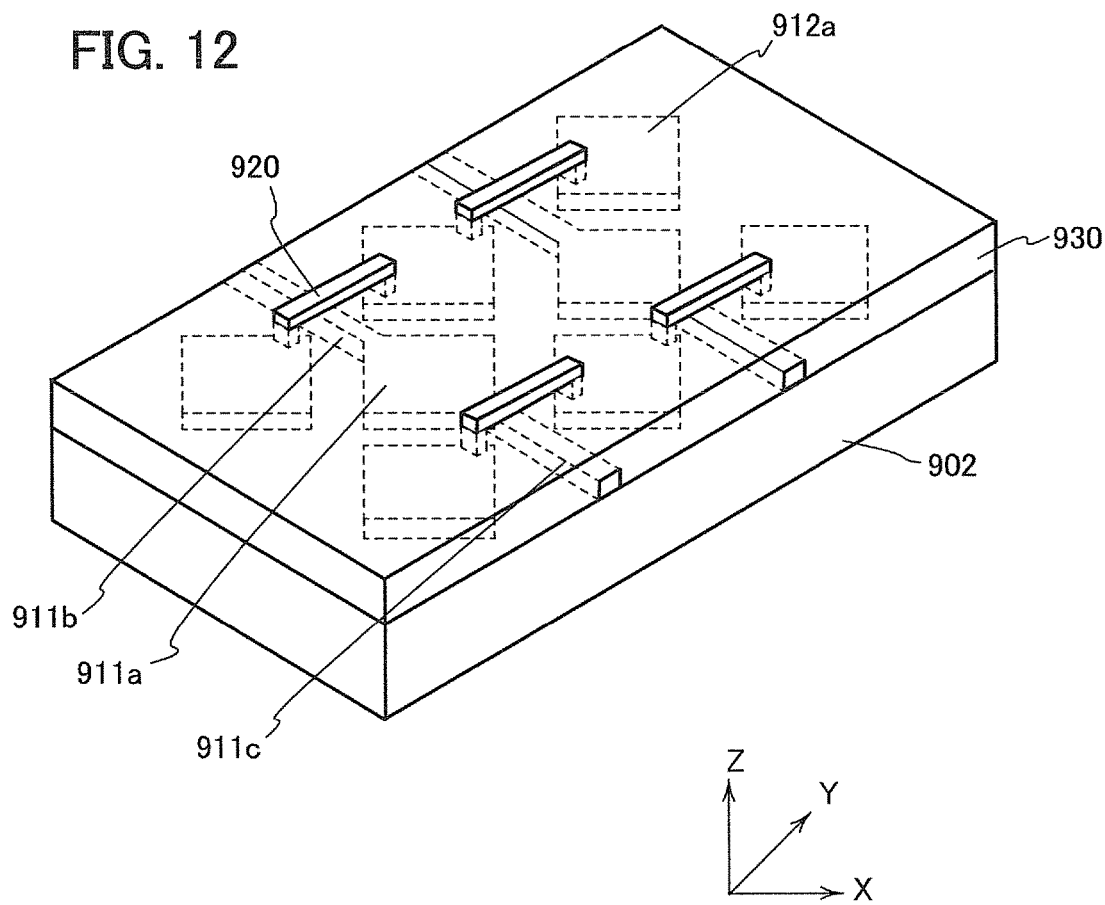
FIG. 12 is a perspective view illustrating one embodiment of the touch panel.

FIG. 8 and FIG. 9 are top views each showing the second substrate 902, and conductive layers 911 and conductive layers 912 which are formed on the one surface of the second substrate 902 in the light-emitting device of FIGS. 7A and 7B. FIG. 10 is a top view showing the second substrate 902, and the conductive layers 911, the conductive layers 912, and conductive layers 920 which are formed on the one surface of the second substrate 902 in the light-emitting device of FIGS. 7A and 7B. FIG. 11 is a cross-sectional view taken along the line C1-C2 in FIG. 10. FIG. 12 is a perspective view showing the second substrate 902 and the conductive layers 911, the conductive layers 912, and the conductive layers 920 which are formed on the one surface of the second substrate 902 in the light-emitting device of FIGS. 7A and 7B.

The conductive layers 911, the conductive layers 912, the insulating layer 930, and the conductive layers 920 are sequentially provided on the surface of the second substrate 902 which faces the third substrate 903.

In the light-emitting device according to one embodiment of the present invention, on the inner surface of the second substrate 902 of the light-emitting device, ITO films are formed as the conductive layers for exhibiting a touch panel function.

The conductive layers 911 and the conductive layers 912 are formed on the surface of the second substrate 902 which faces the third substrate 903. The conductive layers 911 are arranged along a first direction (X direction in FIG. 8). The conductive layers 912 including the main body portions 912a are arranged along a second direction (Y direction in FIG. 9) that is substantially perpendicular to the first direction. As shown in FIG. 8 and FIG. 9, the conductive layers 911 and the conductive layers 912 are alternately arranged. That is, the plurality of conductive layers 911 is arranged over the second substrate 902 along the first direction (the X direction in FIG. 8), and, among the plurality of conductive layers 911 thus arranged, the plurality of conductive layers 912 is arranged along the second direction (the Y direction in FIG. 9).

Here, one conductive layer 911 is shown as a pattern 1000 in FIG. 8. The conductive layers 911 each include a plurality of main body portions 911a, a plurality of joining portions 911b, one extension portion 911c, and one connection portion 911d. The main body portions 911a are each formed into a substantially rhombic shape (square shape) and are provided in line along the first direction, e.g., in the X direction in FIG. 8. The joining portions 911b are formed between the adjacent main body portions 911a to join the adjacent main body portions 911a. The extension portion 911c is formed by extension of one end portion of the main body portion 911a of the conductive layer. In the plurality of conductive layers 911, all of extension portions 911c can extend in one direction, e.g., in the Y direction shown in FIG. 8 and gather in one edge portion of the second substrate 902, i.e., the upper side in FIG. 8. Further, the connection portion 911d is formed in the end portion of the extension portion 911c. The connection portion 911d is electrically connected to the data line 914 of the third substrate 903 via a conductive material to be described later.

One conductive layer 912 is shown as a pattern 2000 in FIG. 9. The conductive layers 912 each include a plurality of main body portions 912a, one extension portion 912c, and one connection portion 912d. The main body portions 912a are each formed into a substantially rhombic shape (square shape) and are provided in line along the second direction, e.g., in the Y direction in FIG. 9. Here, unlike the above-described conductive layers 911, some of the conductive layers 912 do not include a joining portion, and therefore, some of the main body portions 912a are not joined together. With the use of the conductive layers 920 to be described later, some of the main body portions 912a are joined together. The extension portion 912c is formed by extension of one end portion of the main body portion 912a of the conductive layer. In the plurality of conductive layers 912, all of extension portions 912c can extend in one direction, e.g., in the Y direction shown in FIG. 9 and gather in one edge portion of the second substrate 902, i.e., on the upper side in FIG. 9. Further, the connection portion 912d is formed in the end portion of the extension portion 912c. The connection portion 912d is electrically connected to the data line 914 of the third substrate 903 via a conductive material to be described later.

As shown in FIG. 11 and FIG. 12, on the surface of the second substrate 902 which faces the third substrate 903, the insulating layer 930 is formed to cover the conductive layers 911 and 912. The insulating layer 930 has a function of insulating the conductive layers 911 and 912 from the conductive layer 920. A contact hole 931 can be formed in a predetermined position of the insulating layer 930, e.g., in the vicinity of the end portions of the main body portion 912a of the conductive layer 912 which face each other. The main body portion 912a of the conductive layer 912 and the conductive layer 920 are joined together through the contact hole 931.

As shown in FIG. 10, FIG. 11, and FIG. 12, the conductive layer 920 is formed on a surface of the insulating layer 930 which faces the third substrate 903. At this time, the conductive layer 920 is formed to fill the contact hole 931 in the insulating layer 930 and has a function of electrically connecting the adjacent main body portions 912a of the conductive layer 912.

Through such a structure, the conductive layer 911 and the conductive layer 912 formed in directions orthogonal to each other can be provided not to intersect with each other. Hence, electrical shorting between the conductive layer 911 and the conductive layer 912 can be prevented.

Here, the conductive layers 911, 912, and 920 can be formed using, for example, indium oxide (e.g., $In_2O_3$), tin oxide (e.g., $SnO_2$), ZnO, ITO, indium zinc oxide, or any of these metal oxide materials in which silicon oxide is contained. The conductive layers 911, 912, and 920 can be formed by a photolithography step. That is, an ITO layer formed by an evaporation method, a spin coating method, a sputtering method, an ink jet method, or the like is patterned, and thus, the conductive layers 911, 912, and 920 can be formed. The insulating layer 930 can be formed using an inorganic insulating material which is the same or substantially the same as a material of the gate insulating layer 108.

With the above-described structure, the conductive layer 911, the conductive layer 912, the conductive layer 920, and the insulating layer 930 can be formed on the inner surface of the second substrate 902. Thus, a thin and flexible light-emitting device including a touch panel can be fabricated.

<Method for Fabricating Light-Emitting Device>

A method for fabricating the light-emitting device of one embodiment of the present invention is illustrated in FIGS. 2A to 2F, FIGS. 3A and 3B, FIGS. 4A to 4D, FIGS. 5A and 5B, and FIGS. 6A to 6C. The above description can be referred to for the materials of the components described below.

First, the separation layer 101 is formed over the first substrate 901 (see FIG. 2A). The first substrate 901 may be a glass substrate, a quartz substrate, a sapphire substrate, a ceramic substrate, a metal substrate, or the like. The separation layer 101 can be formed using any of the above-described materials by a sputtering method, a plasma CVD method, a coating method, a printing method, an evaporation method, or the like. Note that the coating method includes a spin coating method, a droplet discharge method, and a dispensing method.

Figure 2B:
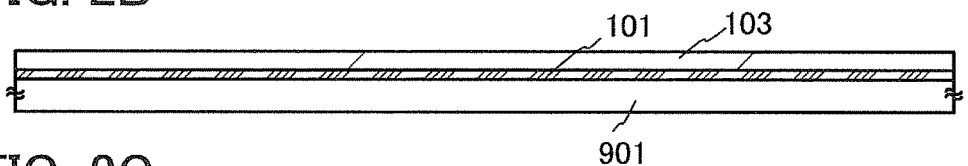

Next, the buffer layer 103 is formed over the separation layer 101 (FIG. 2B). The buffer layer 103 can be a layer which is dense and has very low permeability by forming an insulating layer containing nitrogen and silicon such as a silicon nitride film, a silicon oxynitride film, or a silicon nitride oxide film by a plasma CVD method at a temperature in the range of 250° C. to 400° C.

Figure 2C:
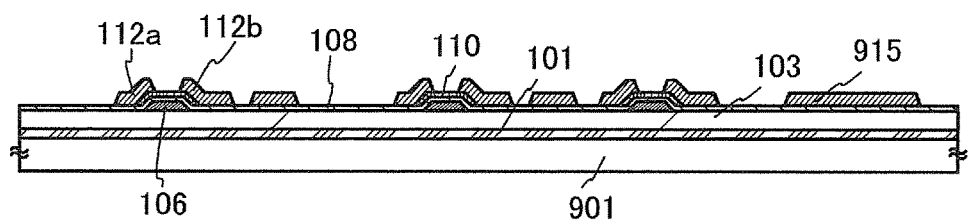

Next, a conductive film is formed over the buffer layer 103 and selectively etched, thereby forming the gate electrode layer 106. Next, the gate insulating layer 108 is formed in contact with the gate electrode layer 106. Next, the semiconductor layer 110 is formed. The semiconductor layer 110 can be formed by a sputtering method, a plasma CVD method, or the like. Next, a conductive film is formed by a sputtering method. The conductive film is selectively etched, thereby forming the source electrode layer 112a, the drain electrode layer 112b, and the conductive layer 915 (FIG. 2C).

Figure 2D:
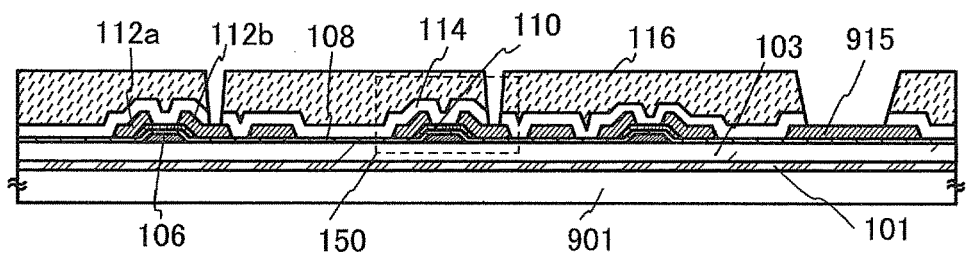

Next, the insulating layer 114 is formed in contact with the semiconductor layer 110, the source electrode layer 112a, and the drain electrode layer 112b. Next, the planarizing layer 116 is formed over the insulating layer 114 (FIG. 2D). Openings are provided in the planarizing layer 116 and the insulating layer 114. Through the openings, the source electrode layer 112a or the drain electrode layer 112b of the transistor can be electrically connected to the first electrode layer 118 to be formed later, and further, the conductive layer 915 can later be electrically connected to the anisotropic conductive film 4519, the bump 4556, the FPC 4518, and the like.

Figure 2E:
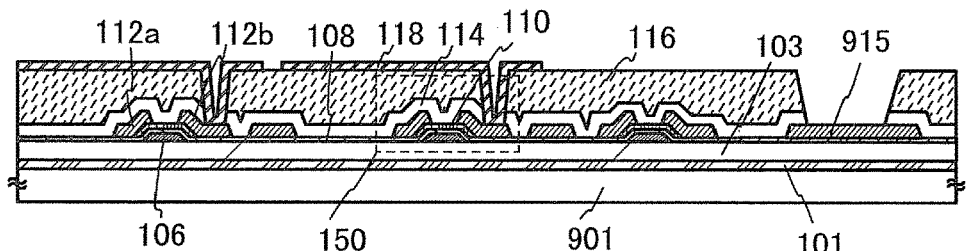

Next, a conductive film is formed and selectively etched, thereby forming the first electrode layer 118 (FIG. 2E).

Figure 2F:
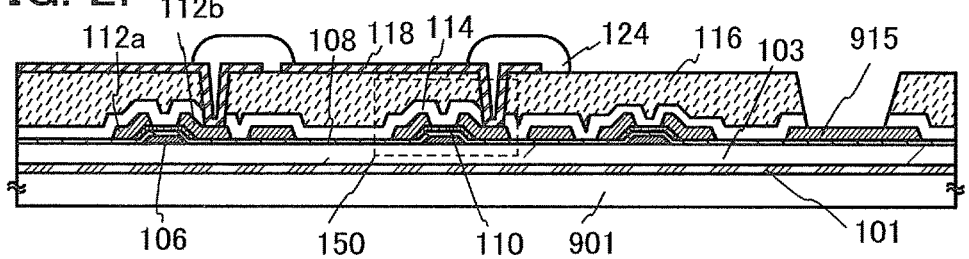

Next, the partition wall 124 is formed to cover the edge portion of the first electrode layer 118. The partition wall 124 electrically insulates adjacent first electrode layers 118 (FIG. 2F). Further, it is preferable that the partition wall 124 have a forward tapered shape so that a film formed over the partition wall 124 is prevented from being broken. In a forward tapered shape, a layer gradually increases in thickness and is in contact with a layer serving as a base.

Figure 3A:
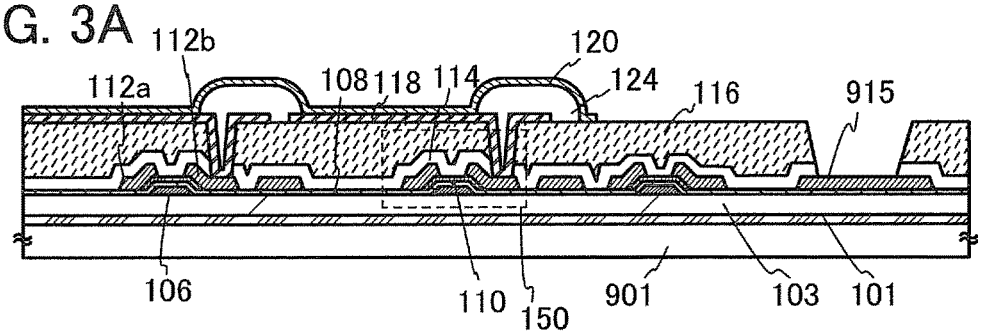
FIGS. 3A and 3B are cross-sectional views illustrating the method for fabricating the light-emitting device of one embodiment of the present invention.

Next, by an evaporation method, the organic compound-containing layer 120 is formed in contact with the first electrode layer 118 and the partition wall 124 (FIG. 3A). In the case where the organic compound-containing layer 120 is formed using a high molecular material, a coating method can be used.

Figure 3B:
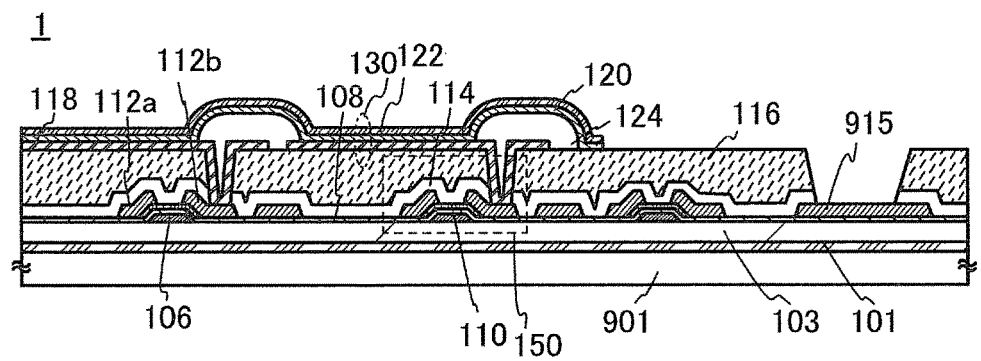

Next, the second electrode layer 122 is formed in contact with the organic compound-containing layer 120 (FIG. 3B). The second electrode layer 122 can be formed by an evaporation method or a sputtering method.

Through the above-described process, the light-emitting element 130 can be formed over the transistor 150. A substrate in which the transistor 150 and the light-emitting element 130 are formed over the first substrate 901 is referred to as a backplane substrate 1.

Figure 4A:
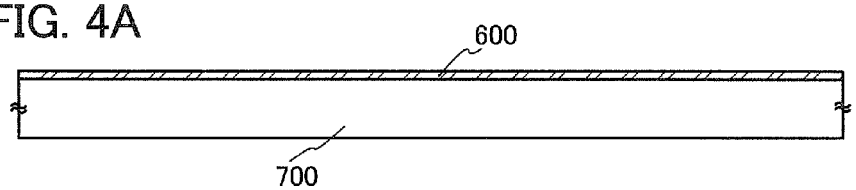
FIGS. 4A to 4D are cross-sectional views illustrating methods for fabricating light-emitting devices of one embodiment of the present invention.

Next, an adsorption layer 600 is formed over a support substrate 700 (FIG. 4A). The support substrate 700 is preferably formed using glass with a thickness greater than or equal to 0.5 mm and less than or equal to 1 mm. The adsorption layer 600 has a resistance against heat and a chemical reaction in a fabrication process. As an adhesive material to be used for the adsorption layer 600, a silicone resin containing a platinum-containing catalyst is preferable.

Figure 4B:
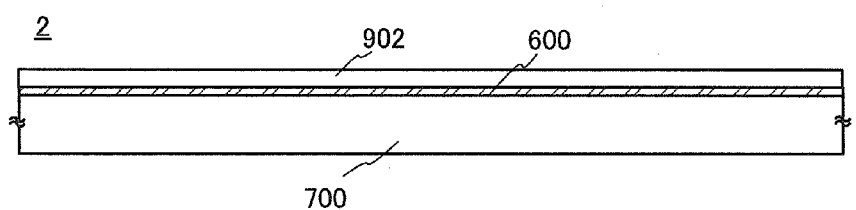

Next, the second substrate 902 is attached so as to be in contact with the adsorption layer 600 (FIG. 4B). A substrate in which the second substrate 902 is attached to the support substrate 700 with the adsorption layer 600 provided therebetween is referred to as a counter substrate 2. The support substrate 700 is bonded to the second substrate 902 with the adsorption layer 600. Note that in a later step, the support substrate 700 can be separated from the second substrate 902.

Figure 4C:
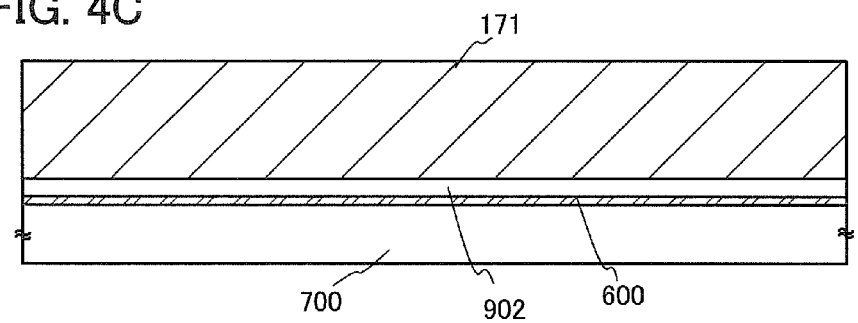

Next, a step of attaching the backplane substrate 1 to the counter substrate 2 is performed. First, a surface of the second substrate 902 of the counter substrate 2 is coated with the first adhesive layer 171 (FIG. 4C).

Figure 5A:
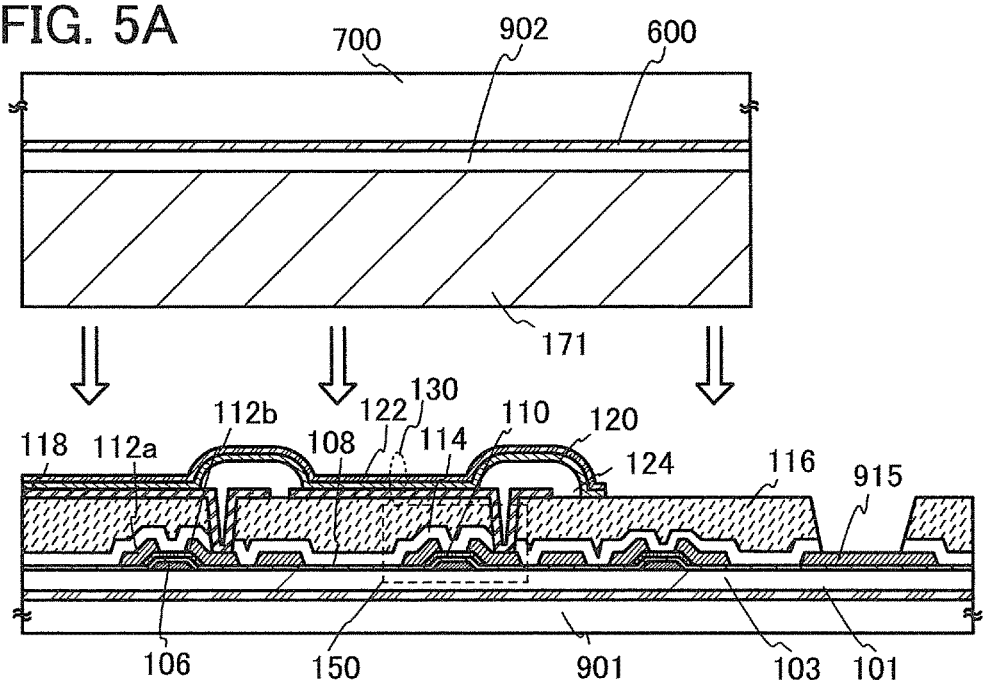
FIGS. 5A and 5B are cross-sectional views illustrating the method for fabricating the light-emitting device of one embodiment of the present invention.
Figure 5B:
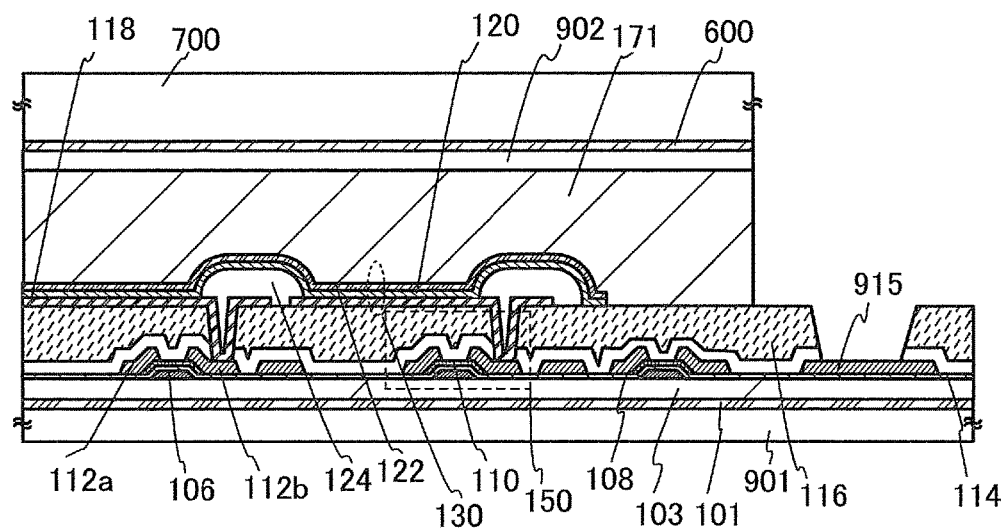

Next, a surface of the backplane substrate 1 over which the light-emitting element 130 and the like are provided is attached to the surface coated with the first adhesive layer 171 (FIGS. 5A and 5B).

Figure 6A:
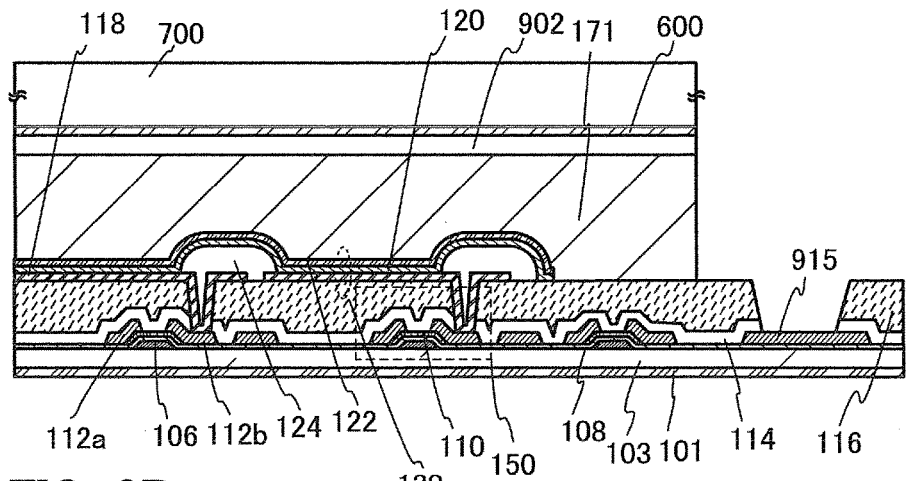
FIGS. 6A to 6C are cross-sectional views illustrating the method for fabricating the light-emitting device of one embodiment of the present invention.
Figure 6B:
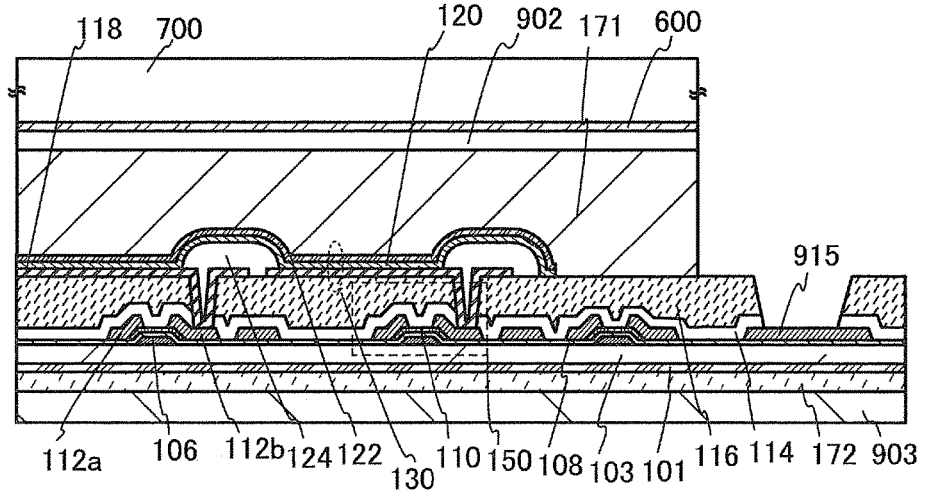

After the first adhesive layer 171 is cured, the first substrate 901 is separated (FIG. 6A), and the third substrate 903 is attached to the separation layer 101 (or the buffer layer 103) with the second adhesive layer 172 (FIG. 6B).

Any of various methods can be used as appropriate as the process for transfer to the third substrate 903. When, as the separation layer 101, a layer including a metal oxide film is formed on the side in contact with a layer to be separated, the metal oxide film is embrittled by being crystallized, and thus the layer to be separated can be separated from a formation substrate. Alternatively, when an amorphous silicon film containing hydrogen is formed as the separation layer between a formation substrate having high heat resistance and a layer to be separated, the amorphous silicon film is removed by laser light irradiation or etching, whereby the layer to be separated can be separated from the formation substrate. Alternatively, after a layer including a metal oxide film is formed as the separation layer on the side in contact with a layer to be separated, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Furthermore, a method may be used in which a film containing nitrogen, oxygen, hydrogen, or the like (for example, an amorphous silicon film containing hydrogen, an alloy film containing hydrogen, an alloy film containing oxygen, or the like) is used as the separation layer 101, and the separation layer is irradiated with laser light to release the nitrogen, oxygen, or hydrogen contained in the separation layer 101 as a gas, thereby promoting separation between the layer to be separated and a formation substrate.

Alternatively, it is possible to use a method in which a formation substrate provided with a layer to be separated is removed mechanically or by etching using a solution or a fluoride gas such as $NF_3$, $BrF_3$, or $ClF_3$, or the like. In this case, the separation layer is not necessarily provided.

When a plurality of the above-described separation methods is combined, the transfer process can be conducted easily. For example, separation can be performed with physical force (by a machine or the like) after performing laser light irradiation, etching on the separation layer with a gas, a solution, or the like, or mechanical removal with a sharp knife, scalpel, or the like so that the separation layer and the layer to be separated can be easily separated from each other.

As another separation method, in the case where the separation layer 101 is formed using tungsten, it is preferable that the separation be performed while etching the separation layer 101 using a mixed solution of ammonium water and a hydrogen peroxide solution.

By the above-described process, the transistor 150 and the light-emitting element 130 can be transferred from the first substrate 901 to the third substrate 903 which is light and flexible.

Figure 6C:
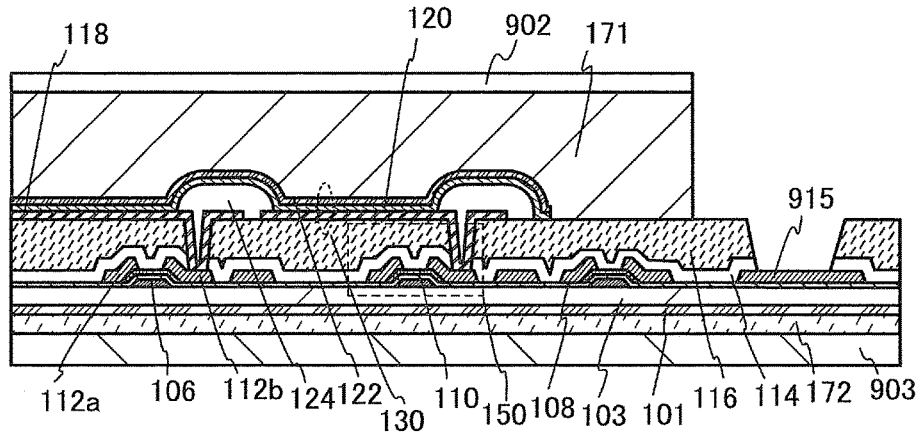

Next, the support substrate 700 is separated from the above-described light-emitting device (FIG. 6C). As a separation method thereof, for example, a cut may be made in the adsorption layer 600 provided between the support substrate 700 and the second substrate 902 with the use of a sharp-edged tool, and the support substrate 700 may be separated from the second substrate 902.

In accordance with the method for fabricating the light-emitting device of one embodiment of the present invention, the light-emitting device can be fabricated with the use of the second substrate 902 and the third substrate 903. The second substrate 902 is glass with a thickness greater than or equal to 10 μm and less than or equal to 500 μm, and thus, the weight of the light-emitting device can be reduced. Further, since the third substrate 903 is made of resin, the light-emitting device which is flexible can be obtained.

Figure 4D:
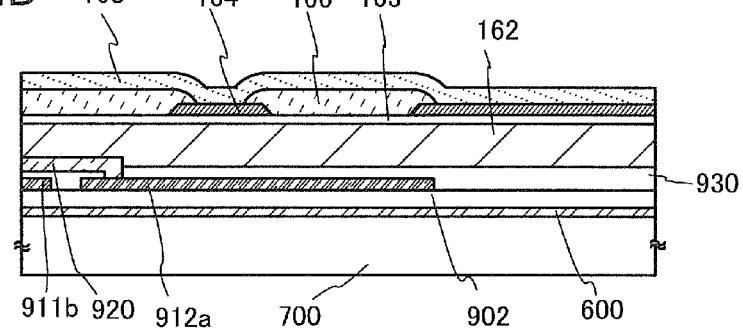

A fabrication method when the structure of FIGS. 7A and 7B is used is described with reference to FIG. 4D.

In a state where the second substrate 902 is bonded to the support substrate 700 with the adsorption layer 600 (FIG. 4B), the following process is performed.

First, the conductive layer 911 and the conductive layer 912 are formed over the second substrate 902, the insulating layer 930 is formed covering the conductive layer 911 and the conductive layer 912, and then, an opening is formed in the insulating layer 930 to expose a part of the conductive layer 912. Then, the conductive layer 920 is formed over the insulating layer 930 and the conductive layer 912. For the details of each component, the above description can be referred to.

Next, the insulating layer 162 is formed by a CVD method, a sputtering method, or the like to cover the conductive layer 920. Next, the passivation layer 163 is formed in contact with the insulating layer 162. Next, the light-blocking film 164 is formed by a photolithography step. Next, the coloring layer 166 is formed by a photolithography step. Next, the overcoat layer 168 is formed in contact with the coloring layer 166. The overcoat layer 168 can prevent thermal diffusion of a pigment contained in the coloring layer 166.

Through the above-described process, the touch panel, the color filter, and the like can be formed over the second substrate 902.

Embodiment 2

In this embodiment, an oxide semiconductor which can be used for the semiconductor layer in Embodiment 1 will be described in detail.

For example, an In-based metal oxide, a Zn-based metal oxide, an In—Zn-based metal oxide, or an In—Ga—Zn-based metal oxide can be used as the oxide semiconductor. Alternatively, a metal oxide including another metal element instead of part or all of Ga in the In—Ga—Zn-based metal oxide may be used.

As the aforementioned another metal element, a metal element that is capable of combining with more oxygen atoms than gallium can be used, for example, and specifically one or more elements of titanium, zirconium, hafnium, germanium, and tin can be used, for instance. Alternatively, as the aforementioned another metal element, one or more elements of lanthanum, cerium, praseodymium, neodymium, samarium, europium, gadolinium, terbium, dysprosium, holmium, erbium, thulium, ytterbium, and lutetium may be used. These metal elements function as a stabilizer. Note that the amount of such a metal element added is determined so that the metal oxide can function as a semiconductor. When a metal element that is capable of combining with more oxygen atoms than gallium is used and oxygen is supplied to a metal oxide, oxygen defects in the metal oxide can be reduced.

Further, the semiconductor layer 110 may be formed using a stacked layer of a first oxide semiconductor layer having an atomic ratio of In:Ga:Zn=1:1:1, a second oxide semiconductor layer having an atomic ratio of In:Ga:Zn=3:1:2, and a third oxide semiconductor layer having an atomic ratio of In:Ga:Zn=1:1:1. When the semiconductor layer 110 is formed using the above-described stacked layer, the field-effect mobility of the transistor can be increased, for example.

The oxide semiconductor may be a c-axis aligned crystalline oxide semiconductor (also referred to as CAAC-OS).

The CAAC-OS is one of oxide semiconductor having a plurality of c-axis aligned crystal parts. In each of the crystal parts, for example, a c-axis is aligned in a direction parallel to a normal vector of a surface where the oxide semiconductor layer including the CAAC-OS is formed or a normal vector of a surface of the oxide semiconductor layer including the CAAC-OS. In this specification, a simple term "perpendicular" includes a range from 85° to 95°. In addition, a simple term "parallel" includes a range from −5° to 5°.

For example, the CAAC-OS can be formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby a crystal state of the sputtering target is transferred to a substrate. In this manner, the CAAC-OS is formed.

For the formation of the CAAC-OS, the following conditions are preferably used.

For example, the CAAC-OS is formed while the impurity concentration is reduced, whereby the crystal state of the oxide semiconductor can be prevented from being broken by the impurities. For example, the concentration of impurities (e.g., hydrogen, water, carbon dioxide, or nitrogen) existing in a deposition chamber is preferably reduced. Further, the concentration of impurities in a deposition gas is preferably reduced. For example, a deposition gas whose dew point is −80° C. or lower, preferably −100° C. or lower is preferably used as a deposition gas.

By increasing the substrate heating temperature during the deposition, migration of a sputtered particle is likely to occur after the sputtered particle is attached to a substrate surface. Specifically, the substrate heating temperature during the deposition is higher than or equal to 100° C. and lower than or equal to 740° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition.

The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_x$ powder, $GaO_y$ powder, and $ZnO_z$ powder in a predetermined ratio, applying pressure, and performing heat treatment at temperature higher than or equal to 1000° C. and lower than or equal to 1500° C. Note that x, y, and z are each a given positive number. Here, the predetermined molar ratio of $InO_x$ powder to $GaO_y$ powder and $ZnO_z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

In a transistor in which a channel formation region includes the CAAC-OS, variations in electric characteristics due to irradiation with visible light and ultraviolet light are small; thus, the transistor has high reliability.

The transistor containing the oxide semiconductor has low leakage current due to thermal excitation because of its wide bandgap. Further, the effective mass of a hole is heavy, which is 10 or more, the height of the tunnel barrier is high, which is 2.8 eV or higher. Thus, the amount of tunnel current is small. Furthermore, the number of carriers in the semiconductor layer is very small; therefore, the off-state current can be made low. For example, the off-state current per micrometer of the channel width of the transistor at room temperature (25° C.) is lower than or equal to $1\times10^{-19}$ A (100 zA), preferably lower than or equal to $1\times10^{-22}$ A (100 yA). It is preferable that the off-state current of the transistor be as low as possible; the lowest level of the off-state current of the transistor is estimated to be about $1\times10^{-30}$ A/μm.

This embodiment can be implemented in appropriate combination with the structures described in the other embodiments.

Embodiment 3

In this embodiment, a structural example which can be used for the light-emitting element 130 in Embodiment 1 will be described in detail.

Figure 13A:
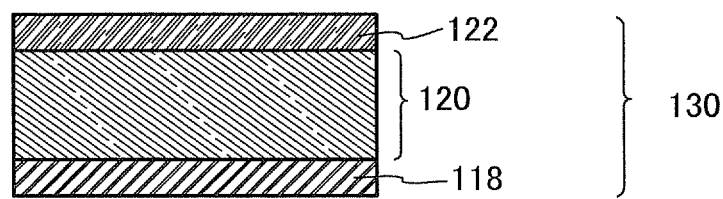
FIGS. 13A and 13B are cross-sectional views each illustrating a light-emitting element of one embodiment of the present invention.

The light-emitting element 130 illustrated in FIG. 13A has a structure in which the organic compound-containing layer 120 is sandwiched between the pair of electrodes (the first electrode layer 118 and the second electrode layer 122). Note that the first electrode layer 118 is used as an anode and the second electrode layer 122 is used as a cathode as an example in the following description of this embodiment.

The organic compound-containing layer 120 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron-transport and hole-transport properties), or the like can be used. Specifically, functional layers such as a hole-injection layer, a hole-transport layer, an electron-transport layer, and an electron-injection layer can be used in combination as appropriate. Either a low molecular compound or a high molecular compound can be used for the organic compound-containing layer 120, and an inorganic compound may also be used. The organic compound-containing layer 120 can be formed by any of the following methods: an evaporation method (including a vacuum evaporation method), a transfer method, a printing method, an inkjet method, a coating method, or the like.

The light-emitting element 130 illustrated in FIG. 13A emits light when current flows because of a potential difference generated between the first electrode layer 118 and the second electrode layer 122, and holes and electrons are recombined in the organic compound-containing layer 120. That is, a light-emitting region is formed in the organic compound-containing layer 120.

In this invention, light emission from the light-emitting element 130 is extracted to the outside from the first electrode layer 118 or the second electrode layer 122 side. Accordingly, one or both of the first electrode layer 118 or the second electrode layer 122 is/are formed using a substance having a light-transmitting property.

Figure 13B:
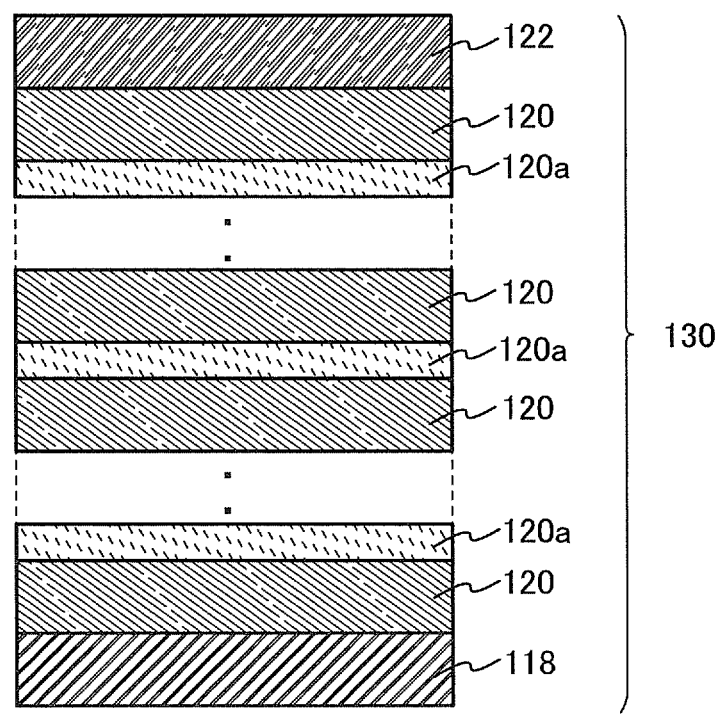

Note that the organic compound-containing layers 120 may be stacked between the first electrode layer 118 and the second electrode layer 122 as illustrated in FIG. 13B. In the case where n (n is a natural number of 2 or more) layers are stacked, a charge generation layer 120a is preferably provided between the m-th (m is a natural number of greater than or equal to 1 and less than or equal to n−1) organic compound-containing layer 120 and the (m+1)-th organic compound-containing layer 120.

The charge generation layer 120a may be formed using a composite material of an organic compound and a metal oxide, a metal oxide, or a composite material of an organic compound and an alkali metal, an alkaline earth metal, or a compound thereof; alternatively, these materials may be combined as appropriate. Examples of the composite material of an organic compound and a metal oxide include an organic compound and a metal oxide such as vanadium oxide, molybdenum oxide, and tungsten oxide. As the organic compound, various compounds can be used; for example, a low molecular compound such as an aromatic amine compound, a carbazole derivative, or aromatic hydrocarbon, or oligomer, dendrimer, polymer, or the like of the low molecular compound can be used. As the organic compound, it is preferable to use the organic compound which has a hole-transport property and has a hole mobility of $10^{-6}$ cm$^2$/Vs or higher. However, other substances than the above described materials may also be used as long as the substances have higher hole-transport properties than electron-transport properties. These materials used for the charge generation layer 120a are excellent in carrier-injection property and carrier-transport property, and thus the light-emitting element 130 can be driven with low current and with low voltage.

It is to be noted that the charge generation layer 120a may be formed with a combination of a composite material of an organic compound and a metal oxide and another material. For example, a layer containing a composite material of the organic compound and the metal oxide may be combined with a layer containing a compound of a substance selected from substances with an electron-donating property and a compound with a high electron-transport property. Alternatively, the charge generation layer 120a may be formed in a combination of a layer containing the composite material of an organic compound and metal oxide with a transparent conductive film.

As for the light-emitting element 130 having such a structure, problems such as energy transfer, quenching, and the like are unlikely to occur, and a light-emitting element which has both high light emission efficiency and long lifetime is easily obtained due to expansion in the choice of materials. Further, a light-emitting element which provides phosphorescence from one of light-emitting layers and fluorescence from the other of the light-emitting layers can be easily obtained.

Note that the charge generation layer 120a has a function of injecting holes to one of the organic compound-containing layers 120, which is formed in contact with the charge generation layer 120a, and a function of injecting electrons to the other of the organic compound-containing layers 120, when voltage is applied between the first electrode layer 118 and the second electrode layer 122.

The light-emitting element 130 illustrated in FIG. 13B can provide a variety of emission colors by changing the type of the light-emitting substance which is used for the organic compound-containing layer 120. In addition, a plurality of light-emitting substances of different colors is used as the light-emitting substance, whereby light emission having a broad spectrum or white light emission can also be obtained.

In the case of obtaining white light emission using the light-emitting element 130 shown in FIG. 13B, as for a combination of a plurality of light-emitting layers, a structure for emitting white light including red light, blue light, and green light may be used. For example, the structure may include a first light-emitting layer containing a blue fluorescent substance as a light-emitting substance and a second light-emitting layer containing green and red phosphorescent substances as light-emitting substances. Alternatively, a structure including a first light-emitting layer exhibiting red light, a second light-emitting layer exhibiting green light, and a third light-emitting layer exhibiting blue light may be employed. Also with a structure including light-emitting layers emitting light of complementary colors, white light emission can be obtained. When light emitted from the first light-emitting layer and light emitted from the second light-emitting layer have complementary colors to each other in a stacked-layer element including two light-emitting layers, the combination of colors are as follows: blue and yellow, blue-green and red, and the like.

In the structure of the above-described stacked-layer element, by providing the charge generation layer between the stacked light-emitting layers, the element can have long lifetime in a high-luminance region while keeping the current density low. In addition, a voltage drop due to the resistance of the electrode material can be reduced, whereby uniform light emission in a large area is possible.

This embodiment can be implemented in appropriate combination with the structures described in the other embodiments.

This application is based on Japanese Patent Application serial no. 2012-151158 filed with Japan Patent Office on Jul. 5, 2012, the entire contents of which are hereby incorporated by reference.

What is claimed is:

1. A light-emitting device comprising:
   a flexible substrate;
   a second adhesive layer over the flexible substrate;
   a buffer layer over the second adhesive layer;
   a transistor over the buffer layer;
   a planarizing layer over the transistor;
   a light-emitting element over the planarizing layer, the light-emitting element including a first electrode layer, an organic compound-containing layer over the first electrode layer, and a second electrode layer over the organic compound-containing layer, the first electrode layer being electrically connected to the transistor;
   a first insulating layer over the light-emitting element, the first insulating layer comprising a planarized surface facing to the flexible substrate;
   a second insulating layer over the first insulating layer;
   a touch sensor including the second electrode layer and a third electrode layer so that a capacitor is formed between the second electrode layer and the third electrode layer, the light-emitting device being configured to interpret change in electrostatic capacitance of the capacitor, the touch sensor overlapped with the second insulating layer;
   a first adhesive layer over the light-emitting element and the planarizing layer; and
   a glass substrate with a thickness greater than or equal to 10 μm and less than or equal to 500 μm over the first adhesive layer,
   wherein the third electrode layer is provided between the first adhesive layer and the glass substrate.

2. The light-emitting device according to claim 1, further comprising:
   a coloring layer between the glass substrate and the first adhesive layer,
   wherein the third electrode layer is closer to the glass substrate than the coloring layer is.

3. The light-emitting device according to claim 1,
   wherein the second adhesive layer is an epoxy resin layer, an acrylic resin layer, or an imide resin layer.

4. The light-emitting device according to claim 1,
   wherein the second adhesive layer is a light curable adhesive layer.

5. The light-emitting device according to claim 1,
   wherein the buffer layer is a silicon oxide layer, a gallium oxide layer, a hafnium oxide layer, a yttrium oxide layer, an aluminum oxide layer, a silicon nitride layer, an aluminum nitride layer, a silicon oxynitride layer, an aluminum oxynitride layer, or a silicon nitride oxide layer.

6. The light-emitting device according to claim 1,
   wherein the planarizing layer is a polyimide resin layer, an acrylic resin layer, or a silicon oxide layer.

7. The light-emitting device according to claim 1,
   wherein the first adhesive layer is an epoxy resin layer, an acrylic resin layer, or an imide resin layer.

8. The light-emitting device according to claim 1,
   wherein the first adhesive layer is a light curable adhesive layer.

9. The light-emitting device according to claim 1,
   wherein the flexible substrate is a resin substrate.

10. The light-emitting device according to claim 1,
    wherein the flexible substrate is a polyethylene terephthalate resin substrate, a polyethylene naphthalate resin substrate, a polyacrylonitrile resin substrate, a polyimide resin substrate, a polymethyl methacrylate resin substrate, a polycarbonate resin substrate, a polyethersulfone resin substrate, a polyamide resin substrate, a polystyrene resin substrate, a polyamide imide resin substrate, or a polyvinylchloride resin substrate.

11. A light-emitting device comprising:
    a flexible substrate;
    a second adhesive layer comprising a first resin material, the second adhesive layer being over the flexible substrate;
    an oxide insulating film over the second adhesive layer;
    a transistor over the oxide insulating film;
    a planarizing layer comprising an organic resin material, the planarizing layer being over the transistor;

a light-emitting element over the planarizing layer, the light-emitting element including a first electrode layer, an organic compound-containing layer over the first electrode layer, and a second electrode layer over the organic compound-containing layer, the first electrode layer being electrically connected to the transistor;

a first insulating layer over the light-emitting element, the first insulating layer comprising a planarized surface facing to the flexible substrate;

a second insulating layer over the first insulating layer;

a touch sensor including the second electrode layer and a third electrode layer so that a capacitor is formed between the second electrode layer and the third electrode layer, the light-emitting device being configured to interpret change in electrostatic capacitance of the capacitor, the touch sensor overlapped with the second insulating layer;

a first adhesive layer comprising a second resin material, the first adhesive layer being over the light-emitting element and the planarizing layer; and a glass substrate with a thickness greater than or equal to 10 μm and less than or equal to 500 μm over the first adhesive layer, wherein the third electrode layer is provided between the first adhesive layer and the glass substrate.

12. The light-emitting device according to claim 11, further comprising:

a coloring layer between the glass substrate and the first adhesive layer, wherein the third electrode layer is closer to the glass substrate than the coloring layer is.

13. The light-emitting device according to claim 11, wherein the second adhesive layer is an epoxy resin layer, an acrylic resin layer, or an imide resin layer.

14. The light-emitting device according to claim 11, wherein the second adhesive layer is a light curable adhesive layer.

15. The light-emitting device according to claim 11, wherein the oxide insulating film is a silicon oxide layer, a gallium oxide layer, a hafnium oxide layer, a yttrium oxide layer, an aluminum oxide layer, a silicon oxynitride layer, an aluminum oxynitride layer, or a silicon nitride oxide layer.

16. The light-emitting device according to claim 11, wherein the planarizing layer is a polyimide resin layer, an acrylic resin layer, or a silicon oxide layer.

17. The light-emitting device according to claim 11, wherein the first adhesive layer is an epoxy resin layer, an acrylic resin layer, or an imide resin layer.

18. The light-emitting device according to claim 11, wherein the first adhesive layer is a light curable adhesive layer.

19. The light-emitting device according to claim 11, wherein the flexible substrate is a resin substrate.

20. The light-emitting device according to claim 11, wherein the flexible substrate is a polyethylene terephthalate resin substrate, a polyethylene naphthalate resin substrate, a polyacrylonitrile resin substrate, a polyimide resin substrate, a polymethyl methacrylate resin substrate, a polycarbonate resin substrate, a polyethersulfone resin substrate, a polyamide resin substrate, a polystyrene resin substrate, a polyamide imide resin substrate, or a polyvinylchloride resin substrate.

21. A light-emitting device comprising:

a flexible substrate;

a second adhesive layer comprising a first resin material, the second adhesive layer being over the flexible substrate;

a nitride insulating film over the second adhesive layer;

a transistor over the nitride insulating film;

a planarizing layer comprising an organic resin material, the planarizing layer being over the transistor;

a light-emitting element over the planarizing layer, the light-emitting element including a first electrode layer, an organic compound-containing layer over the first electrode layer, and a second electrode layer over the organic compound-containing layer, the first electrode layer being electrically connected to the transistor;

a first insulating layer over the light-emitting element, the first insulating layer comprising a planarized surface facing to the flexible substrate;

a second insulating layer over the first insulating layer;

a touch sensor including the second electrode layer and a third electrode layer so that a capacitor is formed between the second electrode layer and the third electrode layer, the light-emitting device being configured to interpret change in electrostatic capacitance of the capacitor, the touch sensor overlapped with the second insulating layer;

a first adhesive layer comprising a second resin material, the first adhesive layer being over the light-emitting element and the planarizing layer; and a glass substrate with a thickness greater than or equal to 10 μm and less than or equal to 500 μm over the first adhesive layer, wherein the third electrode layer is provided between the first adhesive layer and the glass substrate.

22. The light-emitting device according to claim 21, further comprising:

a coloring layer between the glass substrate and the first adhesive layer, wherein the third electrode layer is closer to the glass substrate than the coloring layer is.

23. The light-emitting device according to claim 21, wherein the second adhesive layer is an epoxy resin layer, an acrylic resin layer, or an imide resin layer.

24. The light-emitting device according to claim 21, wherein the second adhesive layer is a light curable adhesive layer.

25. The light-emitting device according to claim 21, wherein the nitride insulating film is a silicon nitride layer, an aluminum nitride layer, a silicon oxynitride layer, an aluminum oxynitride layer, or a silicon nitride oxide layer.

26. The light-emitting device according to claim 21, wherein the planarizing layer is a polyimide resin layer, an acrylic resin layer, or a silicon oxide layer.

27. The light-emitting device according to claim 21, wherein the first adhesive layer is an epoxy resin layer, an acrylic resin layer, or an imide resin layer.

28. The light-emitting device according to claim 21, wherein the first adhesive layer is a light curable adhesive layer.

29. The light-emitting device according to claim 21, wherein the flexible substrate is a resin substrate.

30. The light-emitting device according to claim 21, wherein the flexible substrate is a polyethylene terephthalate resin substrate, a polyethylene naphthalate resin substrate, a polyacrylonitrile resin substrate, a polyimide resin substrate, a polymethyl methacrylate resin substrate, a polycarbonate resin substrate, a polyethersulfone resin substrate, a polyamide resin substrate, a polystyrene resin substrate, a polyamide imide resin substrate, or a polyvinylchloride resin substrate.

* * * * *